(12) United States Patent
Han

(10) Patent No.: US 12,059,911 B2
(45) Date of Patent: Aug. 13, 2024

(54) METHOD OF MANUFACTURING DISPLAY DEVICE

(71) Applicant: Samsung Display Co., Ltd., Yongin-si (KR)

(72) Inventor: Jeongwon Han, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 87 days.

(21) Appl. No.: 17/722,842

(22) Filed: Apr. 18, 2022

(65) Prior Publication Data

US 2023/0055787 A1 Feb. 23, 2023

(30) Foreign Application Priority Data

Aug. 17, 2021 (KR) .................. 10-2021-0108141

(51) Int. Cl.
*B41J 3/407* (2006.01)
*H10K 71/13* (2023.01)

(52) U.S. Cl.
CPC ............ *B41J 3/407* (2013.01); *H10K 71/135* (2023.02)

(58) Field of Classification Search
CPC ................................................... H10K 71/135
See application file for complete search history.

(56) References Cited

U.S. PATENT DOCUMENTS

| 2004/0123753 A1* | 7/2004 | Yoo ........................ B41M 3/003 101/158 |
| 2005/0078240 A1* | 4/2005 | Murade ............. G02F 1/136209 349/110 |
| 2007/0153337 A1* | 7/2007 | Kim .................. H01L 27/14632 257/E27.132 |
| 2008/0136327 A1* | 6/2008 | Lim ........................ H01J 11/36 313/582 |
| 2008/0211849 A1* | 9/2008 | Pierik .................. B41J 2/04586 347/14 |
| 2015/0290613 A1* | 10/2015 | Sampas ............. B01F 33/30351 506/30 |
| 2016/0252812 A1* | 9/2016 | Yamada ................ G03F 7/0388 257/40 |
| 2018/0374909 A1* | 12/2018 | Nishikiori ............ H10K 59/122 |

FOREIGN PATENT DOCUMENTS

| CN | 103676137 A | 3/2014 |
| CN | 103852887 A | 6/2014 |
| CN | 106054371 A | 10/2016 |
| JP | 2003257654 A | 9/2003 |
| KR | 101039295 B1 | 6/2011 |
| KR | 1020180102489 A | 9/2018 |

* cited by examiner

*Primary Examiner* — Robert A Vetere
(74) *Attorney, Agent, or Firm* — CANTOR COLBURN LLP

(57) ABSTRACT

A method of manufacturing a display device includes: discharging ink onto a substrate including a main partition wall for partitioning a color filter area and a dummy accommodation area adjacent to the color filter area; generating main position information by detecting a position of the first erroneous ink discharged on the main partition wall; disposing a hydrophobic plate so as to be adjacent to the first erroneous ink, based on the main position information; bringing the hydrophobic plate into contact with the main partition wall; and then moving the hydrophobic plate to the dummy accommodation area, to accommodate the first erroneous ink in the dummy accommodation area.

18 Claims, 27 Drawing Sheets

METHOD OF MANUFACTURING DISPLAY DEVICE

This application claims priority to Korean Patent Application No. 10-2021-0108141, filed on Aug. 17, 2021, and all the benefits accruing therefrom under 35 U.S.C. § 119, the content of which in its entirety is herein incorporated by reference.

BACKGROUND

1. Field

The present invention relates to a method of manufacturing a display device. More specifically, the present invention relates to a method of manufacturing a display device using an inkjet process.

2. Description of the Related Art

A display device may include a lower substrate and an upper substrate. The lower substrate may include a plurality of pixels, and each of the pixels may emit light. The upper substrate may include a color conversion layer and a color filter layer that correspond to the pixels. The color conversion layer and the color filter layer may change the color of light emitted from each of the pixels.

SUMMARY

Upon forming the lower substrate, the color conversion layer may be formed using an inkjet process. In the above case, defects may occur due to erroneous ink. Accordingly, the display performance of the display device may deteriorate.

The present invention provides a method of manufacturing a display device to improve the display performance of the display device.

However, the aspect of the present invention is not limited to the above-described aspect, and may be variously expanded without departing from the spirit and scope of the present invention.

The method of manufacturing a display device according to the embodiments includes: discharging ink onto a substrate including a main partition wall for partitioning a color filter area and a dummy accommodation area adjacent to the color filter area; detecting a position of first erroneous ink discharged on the main partition wall to generate main position information; disposing a hydrophobic plate so as to be adjacent to the first erroneous ink based on the main position information; bringing the hydrophobic plate into contact with the main partition wall; and then moving the hydrophobic plate in a direction to the dummy accommodation area, to accommodate the first erroneous ink in the dummy accommodation area.

In one embodiment, the substrate may further include a sub-partition wall for partitioning the dummy accommodation area into a plurality of sub-dummy accommodation areas.

In one embodiment, the method of manufacturing the display device may further include: generating sub-position information by detecting a position of second erroneous ink discharged on the sub-partition wall; disposing the hydrophobic plate so as to be adjacent to the second erroneous ink, based on the sub-position information; bringing the hydrophobic plate into contact with the sub-partition wall; and then moving the hydrophobic plate in a direction to one of the sub-dummy accommodation areas, to accommodate the second erroneous ink in the one of the sub-dummy accommodation areas.

In one embodiment, the sub-partition wall may include a first sub-partition wall having an octagonal shape in a plan view, and a plurality of second sub-partition walls extending in directions to the main partition wall from vertices of the first sub-partition wall having the octagonal shape, respectively.

In one embodiment, the sub-partition wall may have hydrophobicity.

In one embodiment, the color filter area may include: a first color filter area for accommodating first ink including a first color conversion particle and a first scattering body; a second color filter area for accommodating second ink including a second color conversion particle and a second scattering body; and a third color filter area for accommodating third ink including a third scattering body.

In one embodiment, the first color filter area and the third color filter area may be alternately and repeatedly arranged in a first direction to define a first row, the second color filter area and the dummy accommodation area may be alternately and repeatedly arranged in the first direction to define a second row, and the first row and the second row may be alternately and repeatedly arranged in a second direction perpendicular to the first direction.

In one embodiment, a width of the hydrophobic plate may be less than or equal to a width of the first row in the second direction.

In one embodiment, the main partition wall may have hydrophobicity.

In one embodiment, the hydrophobicity of the hydrophobic plate may be greater than that of the main partition wall.

The method of manufacturing a display device according to the embodiments includes: discharging ink onto a substrate including a color filter area, a dummy accommodating area and a main partition wall for partitioning the color filter area and the dummy accommodation area adjacent to the color filter area; detecting a position of first erroneous ink discharged on the main partition wall to generate main position information; detecting a color of the first erroneous ink to generate main color information; comparing the color of the first erroneous ink with a color of the ink discharged to the color filter area, based on the main color information; bringing the hydrophobic plate disposed adjacent to the first erroneous ink into contact with the main partition wall based on the main position information; and then moving the hydrophobic plate in a direction to the color filter area to accommodate the first erroneous ink in the color filter area, when the color of the first erroneous ink is identical to the color of the ink discharged to the color filter area.

In one embodiment, the method of manufacturing the display device may further include: moving the hydrophobic plate in a direction to the dummy accommodation area to accommodate the first erroneous ink in the dummy accommodation area, when the color of the first erroneous ink is different from the color of the ink discharged to the color filter area.

In one embodiment, the substrate may further include a sub-partition wall for partitioning the dummy accommodation area into a plurality of sub-dummy accommodation areas.

In one embodiment, the method of manufacturing the display device may further includes: generating sub-position information by detecting a position of second erroneous ink discharged on the sub-partition wall; generating sub-color information by detecting the color of the second erroneous ink discharged on the sub-partition wall; comparing the color of the second erroneous ink with the color of the ink discharged to the color filter area, based on the sub-color information; bringing the hydrophobic plate disposed adjacent to the second erroneous ink into contact with the sub-partition wall based on the sub-position information; and then moving the hydrophobic plate in the direction to the color filter area to accommodate the second erroneous ink in the color filter area, when the color of the second erroneous ink is identical to the color of the ink discharged to the color filter area.

In one embodiment, the method of manufacturing the display device may further include: moving the hydrophobic plate in a direction to one of the sub-dummy accommodation areas to accommodate the second erroneous ink in the one of the plurality of sub-dummy accommodation areas, when the color of the second erroneous ink is different from the color of the ink discharged to the color filter area.

In one embodiment, the sub-partition wall may include a first sub-partition wall having an octagonal shape in a plan view, and a plurality of second sub-partition walls extending in a direction to the main partition wall from vertices of the first sub-partition wall having the octagonal shape, respectively.

In one embodiment, the sub-partition wall may have hydrophobicity.

In one embodiment, the main partition wall may have hydrophobicity.

In one embodiment, the hydrophobicity of the hydrophobic plate may be greater than that of the main partition wall.

In one embodiment, the color filter area may include: a first color filter area for accommodating first ink including a first color conversion particle and a first scattering body; a second color filter area for accommodating second ink including a second color conversion particle and a second scattering body; and a third color filter area for accommodating third ink including a third scattering body.

The method of manufacturing the display device according to the embodiments may include: discharging ink onto a substrate including a main partition wall for partitioning a color filter area and a dummy accommodation area adjacent to the color filter area; detecting a position of first erroneous ink discharged on the main partition wall to generate main position information; disposing a hydrophobic plate so as to be adjacent to the first erroneous ink based on the main position information; and bringing the hydrophobic plate into contact with the main partition wall, and then moving the hydrophobic plate in a direction to the dummy accommodation area, thereby accommodating the first erroneous ink in the dummy accommodation area. Accordingly, the first erroneous ink may be prevented from being positioned on the main partition wall, so that the display performance of the display device can be effectively improved.

The method of manufacturing the display device according to the embodiments may include: discharging ink onto a substrate including a main partition wall for partitioning a color filter area and a dummy accommodation area adjacent to the color filter area; detecting a position of first erroneous ink discharged on the main partition wall to generate main position information; detecting the color of the first erroneous ink to generate main color information; comparing the color of the first erroneous ink with the color of the ink discharged to the color filter area based on the main color information; and bringing the hydrophobic plate disposed adjacent to the first erroneous ink into contact with the main partition wall based on the main position information, and then moving the hydrophobic plate in the direction to the color filter area, when the color of the first erroneous ink is identical to the color of the ink discharged to the color filter area, so that the first erroneous ink may be accommodated in the color filter area. Accordingly, the first erroneous ink may be prevented from being positioned on the main partition wall, so that the display performance of the display device can be effectively improved.

However, the effect according to the present invention is not limited to the above-described effects, and may be variously expanded without departing from the spirit and scope of the present invention.

DETAILED DESCRIPTION

Figure 1:
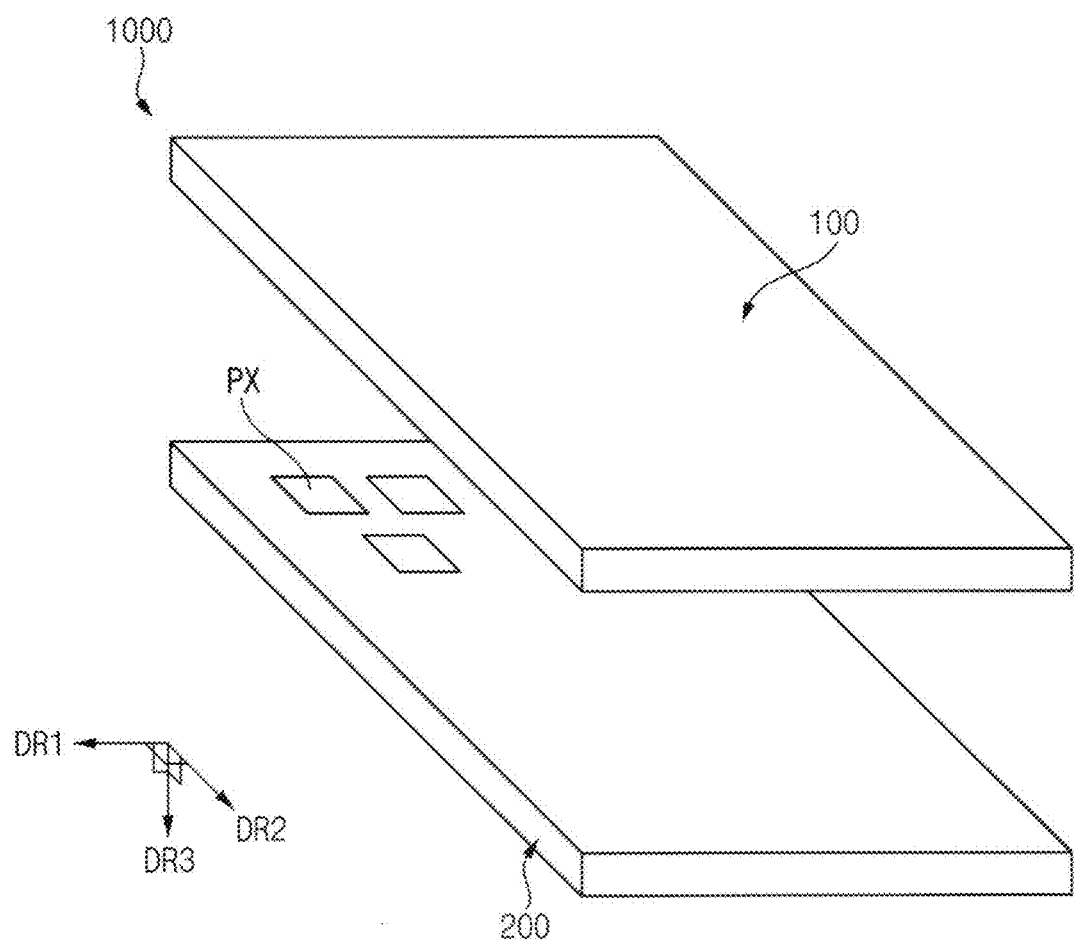
FIG. 1 is a perspective view for explaining a display device according to one embodiment of the present invention.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, a method of manufacturing a display device according to the embodiments of the present invention will be described in more detail with reference to the accompanying drawings. The same or similar reference numerals are used for the same components in the accompanying drawings.

FIG. 1 is a perspective view for explaining a display device according to one embodiment of the present invention.

Referring to FIG. 1, the display device 1000 may include an upper substrate 100 and a lower substrate 200.

The lower substrate 200 may include a plurality of pixels PX. Each of the pixels PX may emit light. In one embodiment, each of the pixels PX may include an organic light emitting element that emits blue light. In another embodiment, each of the pixels PX may include an organic light emitting element that emits white light.

The upper substrate 100 may be coupled on the lower substrate 200. The upper substrate 100 may transmit light emitted from each of the pixels PX. At the same time, the upper substrate 100 may convert a color of light emitted from each of the pixels PX. For example, the light emitted from each of the pixels PX may be converted into any one of red light, blue light, and green light after passing through the upper substrate 100.

Figure 2:
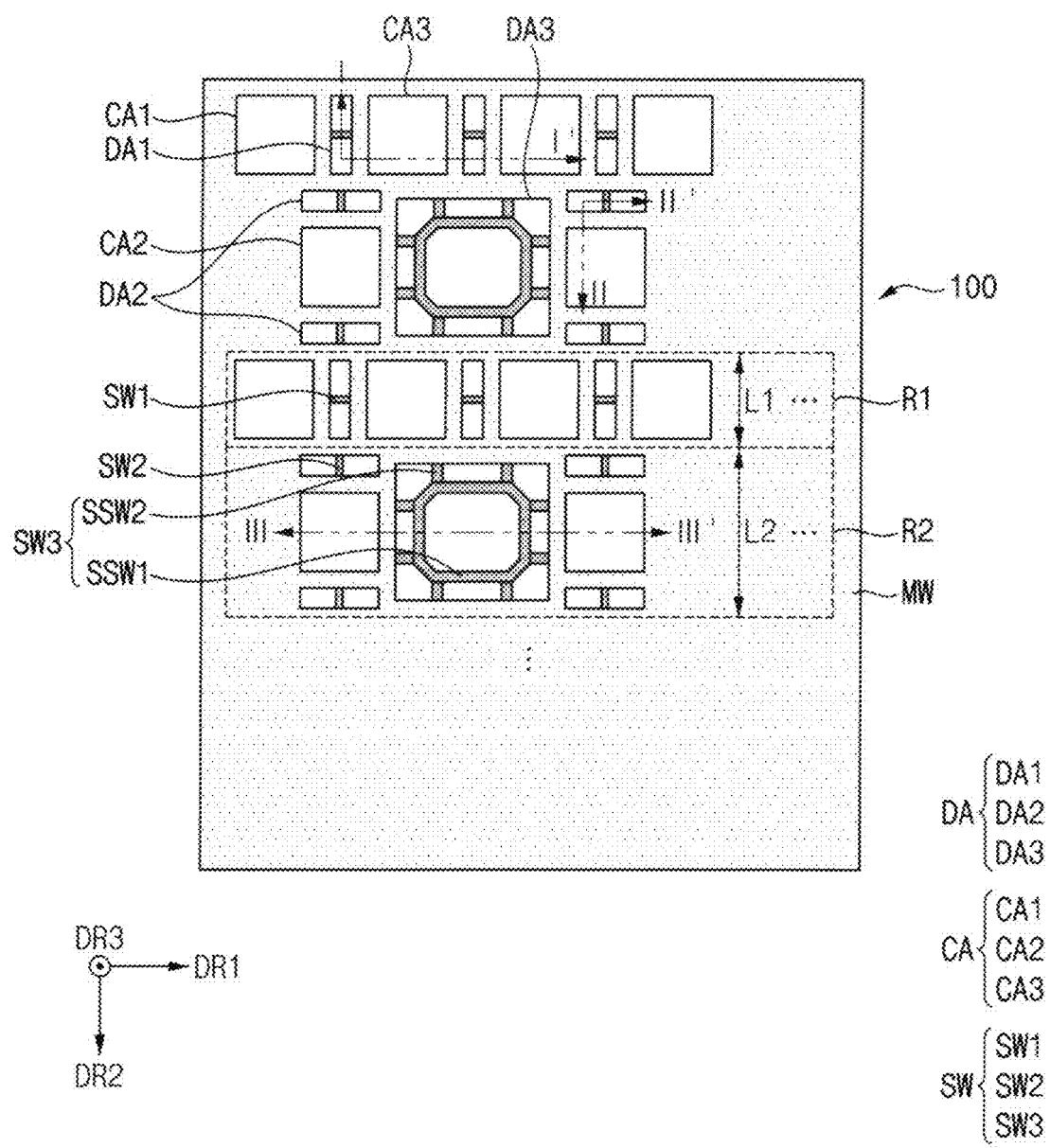
FIG. 2 is a plan view for explaining an upper substrate included in the display device of FIG. 1.

FIG. 2 is a plan view for explaining an upper substrate included in the display device of FIG. 1.

Referring to FIG. 2, the upper substrate 100 may include a main partition wall MW and a sub-partition wall SW.

The main partition wall MW may partition a color filter area CA and a dummy accommodation area DA. The main partition wall MW may include an organic material. For example, the main partition wall MW may contain a polymeric material. In one embodiment, the main partition wall MW may contain a hydrophobic organic material.

The color filter area CA may correspond to each of the pixels PX included in the lower substrate 200. In other words, the color filter area CA may overlap the pixels PX in a plan view. In the color filter area CA, a color conversion material capable of converting a color of light emitted from each of the pixels PX may be accommodated. In one embodiment, ink containing the color conversion material may be discharged to the color filter area CA using an inkjet process, so that the color conversion material may be filled in the color filter area CA.

The color filter area CA may include a first color filter area CA1, a second color filter area CA2, and a third color filter area CA3. The first color filter area CA1 may be an area that converts the light emitted from each of the pixels PX into first light, the second color filter area CA2 may be an area that converts the light emitted from each of the pixels PX into second light, and the third color filter area CA3 may be an area that transmits the third light emitted from each of the pixels PX. In one embodiment, the first light may be a red light, the second light may be a green light, and the third light may be blue light.

The dummy accommodation area DA may include a first dummy accommodation area DA1, a second dummy accommodation area DA2, and a third dummy accommodation area DA3. The dummy accommodation area DA may be an area that accommodates erroneous ink discharged outside the color filter area CA during the inkjet process.

In one embodiment, the first color filter area CA1 and the third color filter area CA3 may be alternately and repeatedly arranged in a first direction DR1 to define a first row R1, the second color filter area CA2 and the third dummy accommodation area DA3 may be alternately and repeatedly arranged in the first direction DR1 to define a second row R2, and the first row R1 and the second row R2 may be alternately and repeatedly arranged in a second direction DR2 perpendicular to the first direction DR1. In the above case, the first dummy accommodation area DA1 may be disposed between first color filter areas CA1 and the third color filter area CA3 which are adjacent to each other, and the second dummy accommodation area DA2 may be disposed between the second color filter area CA2 and the first row R1 which are adjacent to each other.

The sub-partition wall SW may partition the dummy accommodation area DA into a plurality of areas. For example, the dummy accommodation area DA may be partitioned into a plurality of sub-dummy accommodation areas by the sub-partition wall SW. Accordingly, when the main partition wall MW is lost in the manufacturing process of the upper substrate 100, the amount of ink lost from the color filter area CA to the dummy accommodation area DA may be relatively small. In one embodiment, the sub-partition wall SW may have hydrophobicity. In one embodiment, the sub-partition wall SW may be integrally formed (i.e., monolithic) with the main partition wall MW.

The sub-partition wall SW may include a first sub-wall SW1, a second sub-wall SW2, and a third sub-wall SW3.

The first sub-partition wall SW1 may partition the first dummy accommodation area DA1 into two areas.

The second sub-partition wall SW2 may partition the second dummy accommodation area DA2 into two areas.

The third sub-partition wall SW3 may partition the third dummy accommodation area DA3 into a plurality of areas. In one embodiment, the third sub-partition wall SW3 may include a fourth sub-partition wall SSW1 and a fifth sub-partition wall SSW2. The fourth sub-partition wall SSW1 may have an octagonal shape in a plan view. The fifth sub-partition wall SSW2 may extend in the direction to the nearest main partition wall MW from each of vertices of the fourth sub-partition wall SSW1 having the octagonal shape. Due to the fourth sub-partition wall SSW1 and the fifth sub-partition wall SSW2, the third dummy accommodation area DA3 may be partitioned into nine areas.

Figure 3:
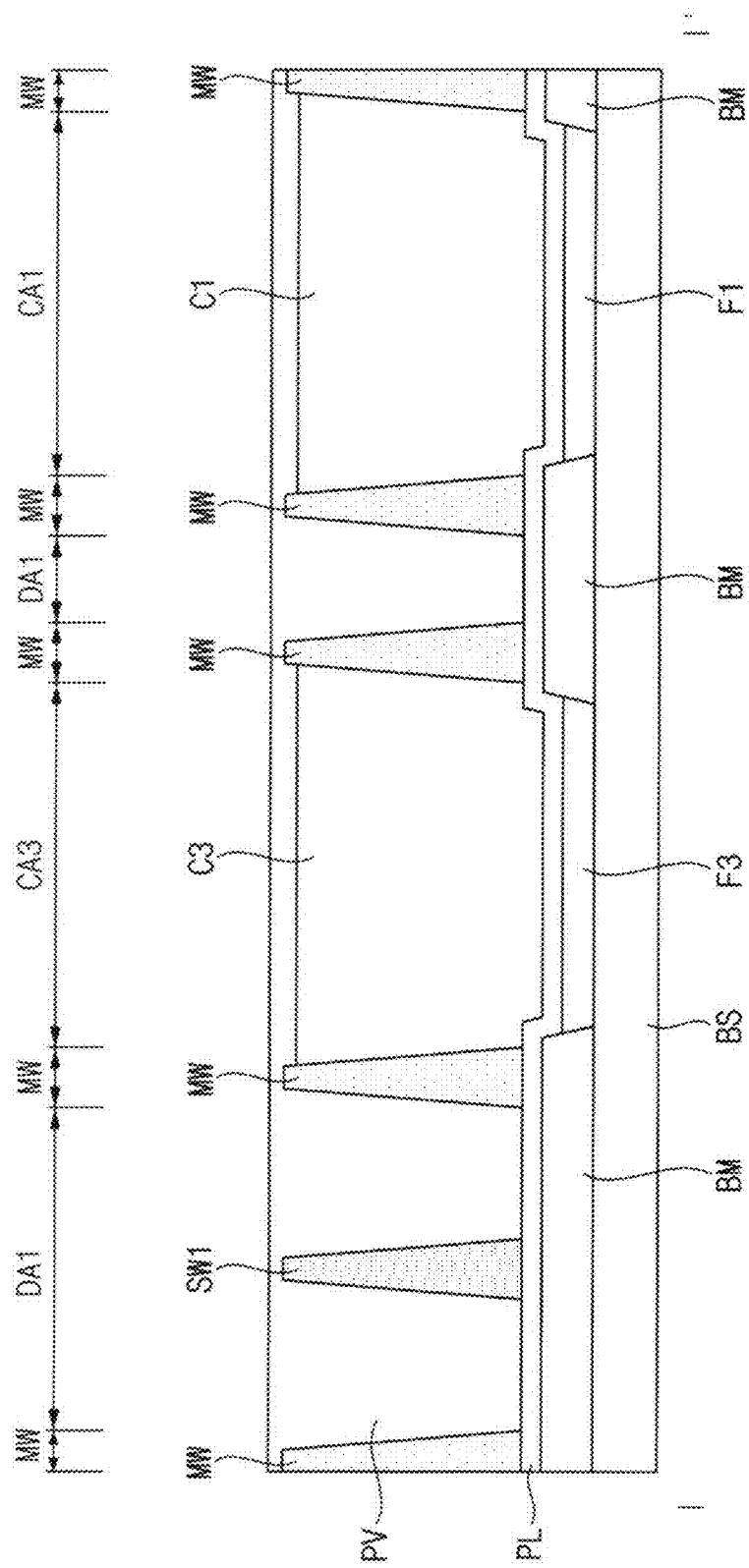
FIG. 3 is a sectional view taken along line I-I" of FIG. 2.
Figure 4:
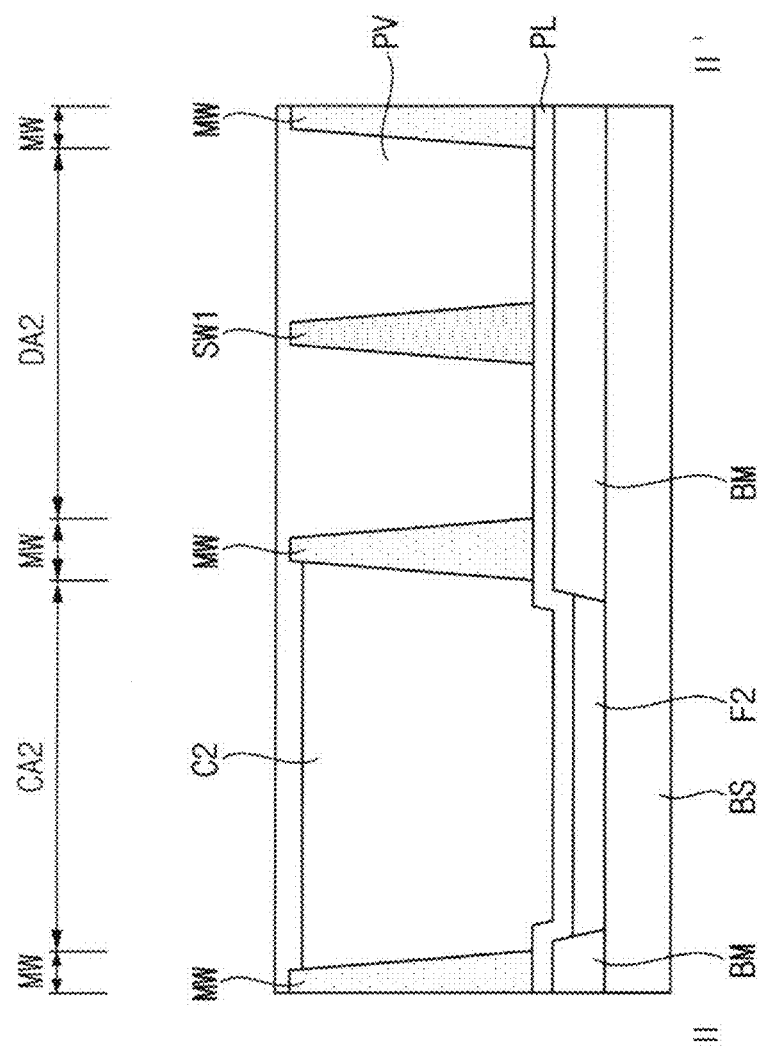
FIG. 4 is a sectional view taken along line II-II' of FIG. 2.
Figure 5:
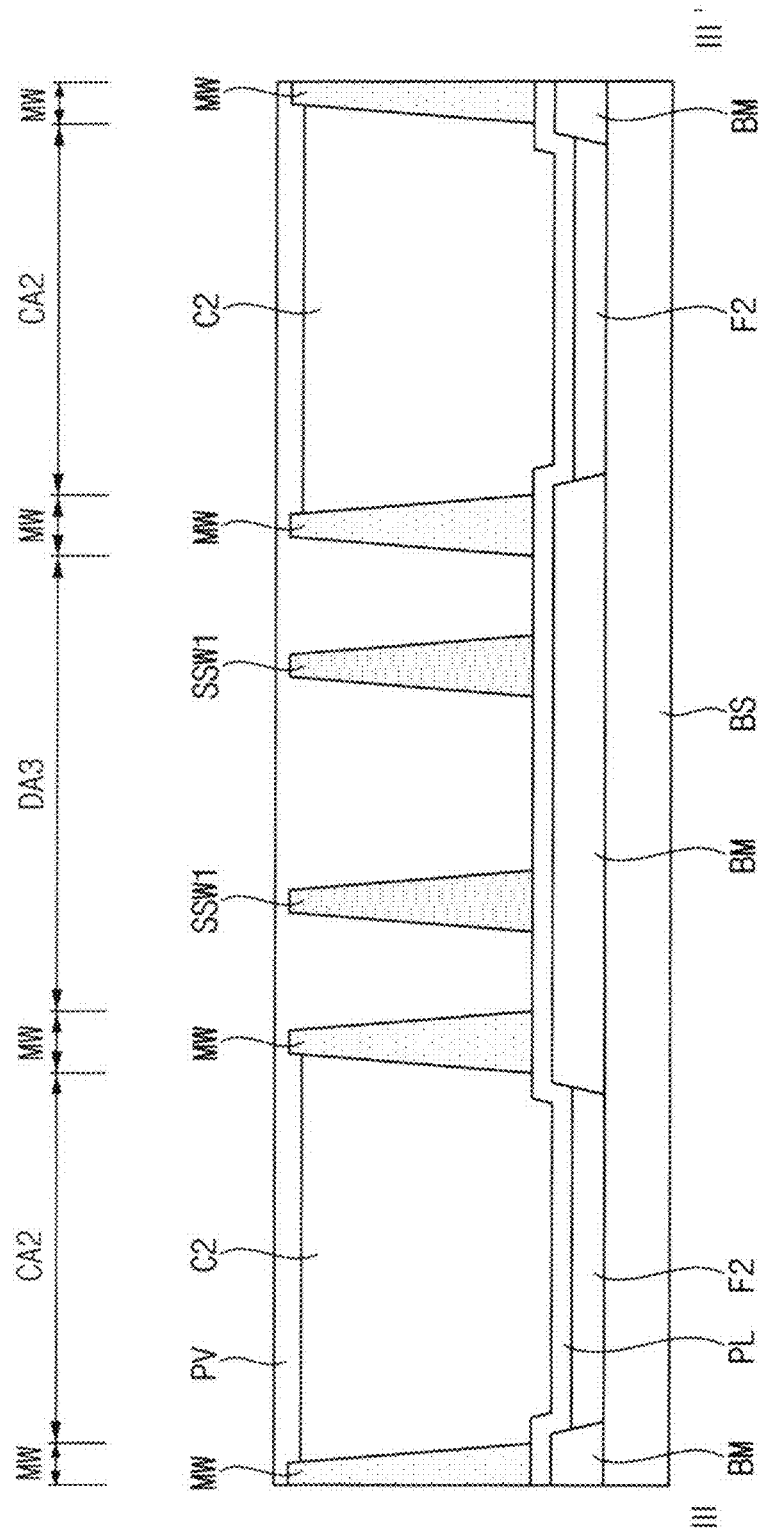
FIG. 5 is a sectional view taken along line III-III' of FIG. 2.

FIG. 3 is a sectional view taken along line I-I" of FIG. 2.
FIG. 4 is a sectional view taken along line II-IP of FIG. 2.
FIG. 5 is a sectional view taken along line III-III' of FIG. 2.

Referring to FIGS. 2 to 5, the upper substrate 100 may include a base substrate BS, a light blocking layer BM, a color filter layers F1, F2 and F3, a protective layer PL, a color conversion layers C1, C2 and C3, a main partition wall MW, a sub-partition wall SW, and a passivation layer PV.

The base substrate BS may include glass, quartz, plastic, polymer materials, or the like. The base substrate BS may transmit light.

The light blocking layer BM may be disposed on the base substrate BS. The light blocking layer BM may block light. The light blocking layer BM may have an opening corresponding to the color filter area CA.

The color filter layers F1, F2 and F3 may be disposed in the opening formed in the light blocking layer BM. Each of the color filter layers F1, F2 and F3 may selectively transmit light having a specific wavelength. For example, the first color filter layer F1 may selectively transmit the first light having a first wavelength, the second color filter layer F2 may selectively transmit the second light having a second wavelength, and the third color filter layer F3 may selectively transmit the third light having a third wavelength. In one embodiment, the first color filter layer F1 may be disposed to correspond to the first color filter area CA1, the second color filter layer F2 may be disposed to correspond to the second color filter area CA2, and the third color filter layer F3 may be disposed to correspond to the third color filter area CA3.

In one embodiment, the light blocking layer BM may be formed by overlapping and laminating the color filter layers F1, F2 and F3 in a plan view. For example, the first color filter layer F1, the second color filter layer F2, and the third color filter layer F3 may be sequentially overlapped and laminated on the base substrate BS, so that the light blocking layer BM may be formed.

The protective layer PL may cover the color filter layers F1, F2 and F3 and the light blocking layer BM. The protective layer PL may protect the color filter layers F1, F2 and F3 and the light blocking layer BM from impurities.

The main partition wall MW and the sub-partition wall SW may be disposed on the protective layer PL. The main partition wall MW may partition the color filter area CA and the dummy accommodation area DA. The sub-partition wall SW may divide the dummy accommodation area DA into the sub-dummy accommodation areas. The main partition wall MW and the sub-partition wall SW may overlap the light blocking layer BM in a plan view.

The passivation layer PV may cover the main partition wall MW, the sub-partition wall SW, and the first to third color conversion layers C1, C2 and C3. The passivation layer PV may protect the color conversion layers C1, C2 and C3 from impurities.

Referring back to FIG. 3, a first color conversion layer C1 may be disposed on the first color filter layer F1, in the first color filter area CA1. The first color conversion layer C1 may include a first color conversion particle and a first scattering body. The first color conversion particle may include first quantum dots having a first size. The first quantum dot may be excited by light emitted from the pixel PX to emit the first light. Accordingly, the first color conversion layer C1 may convert the light emitted from the pixel PX into the first light.

In the third color filter area CA3, a third color conversion layer C3 may be disposed on the third color filter layer F3. The third color conversion layer C3 may include a third scattering body. Accordingly, the third color conversion layer C3 may transmit the light emitted from the pixel PX. In one embodiment, each of the pixels PX may emit the third light, and accordingly, the third color conversion layer C3 may transmit the third light emitted from the pixel PX.

Referring back to FIGS. 4 and 5, a second color conversion layer C2 may be disposed on the second color filter layer F2, in the second color filter area CA2. The second color conversion layer C2 may include a second color conversion particle and a second scattering body. The second color conversion particle may include second quantum dots having a second size. The second quantum dot may be excited by the light emitted from the pixel PX to emit the second light. Accordingly, the second color conversion layer C2 may convert the light emitted from the pixel PX into the second light.

Figure 6:
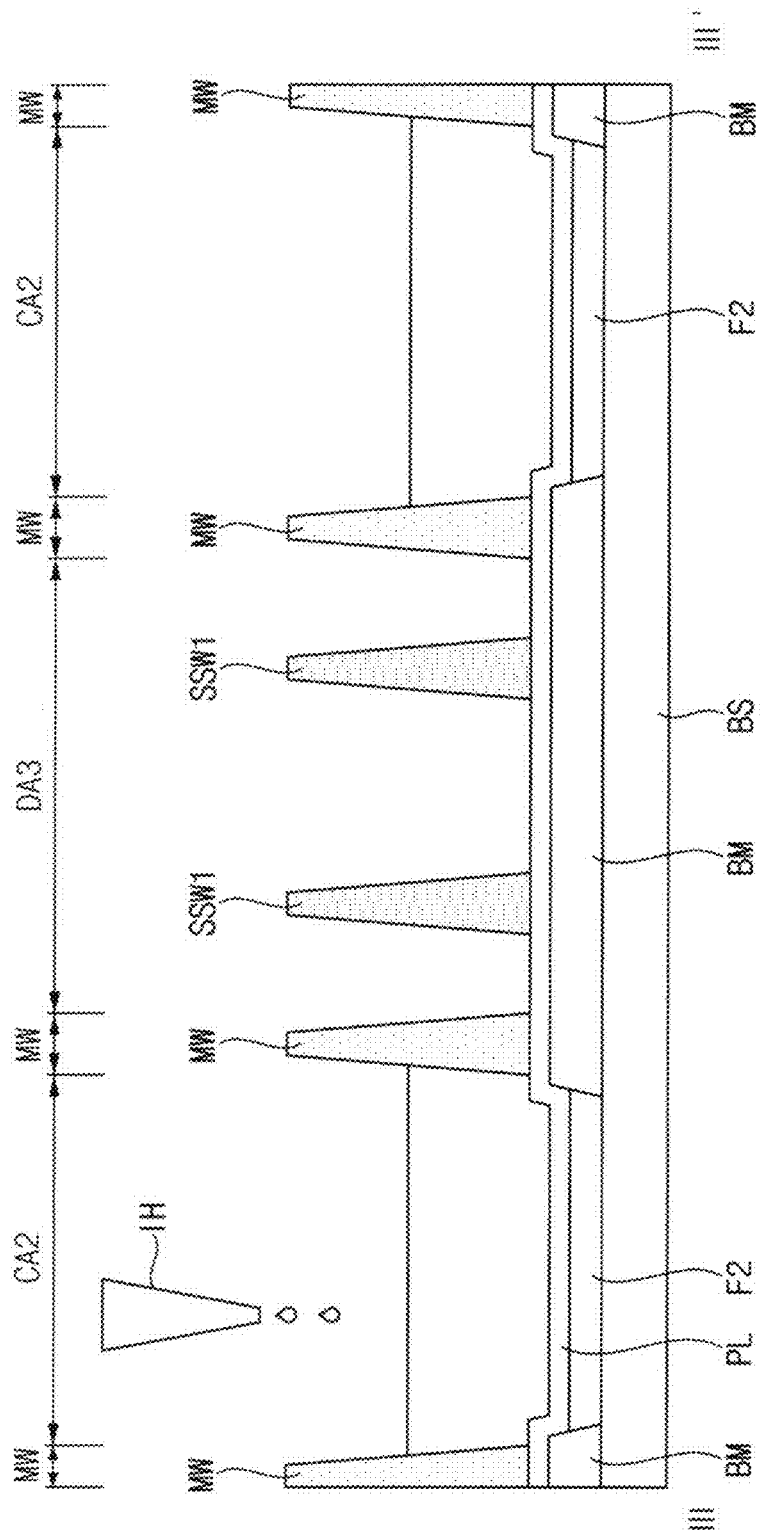
FIGS. 6 and 7 are sectional views for explaining a method of manufacturing the upper substrate of FIG. 2.
Figure 7:
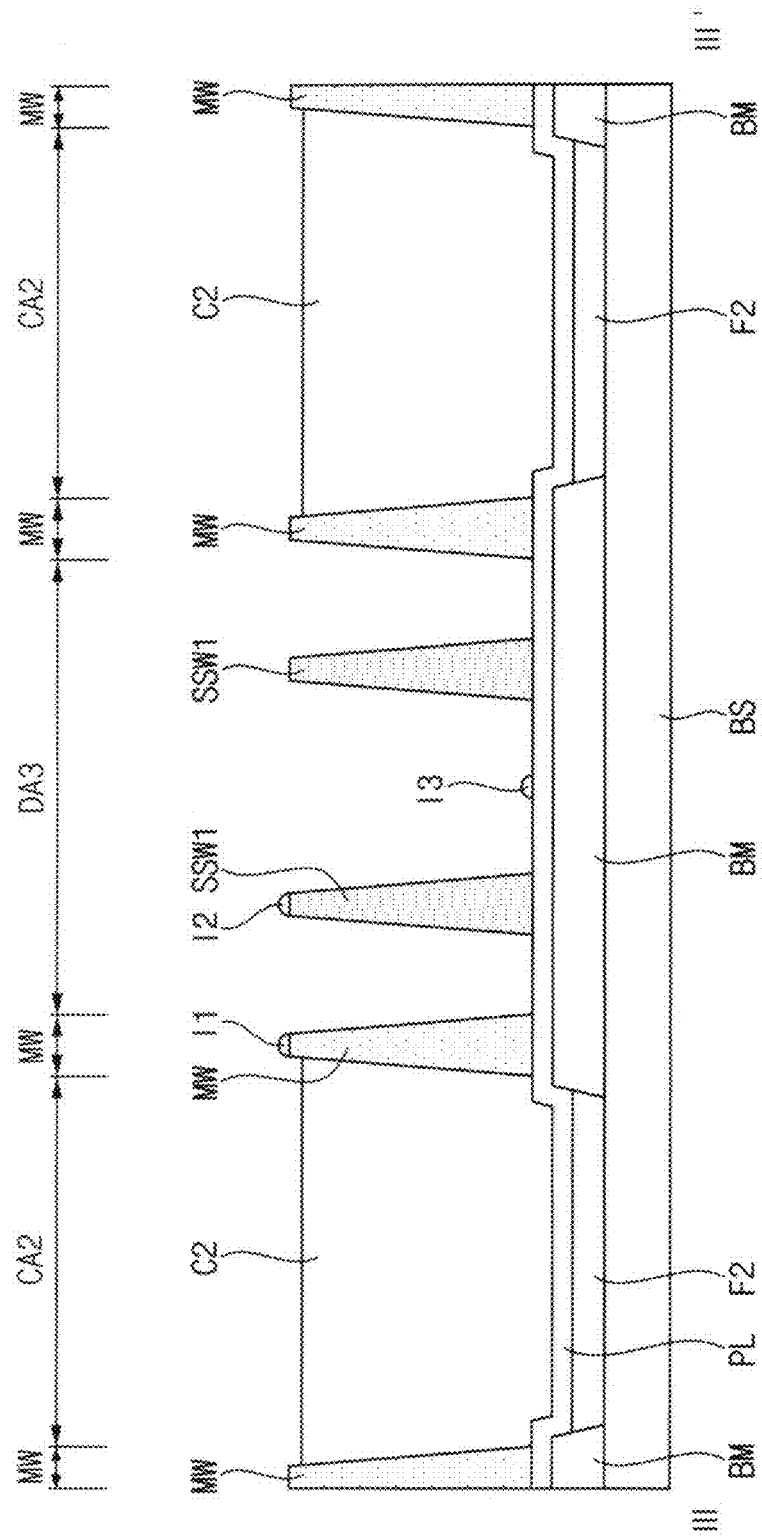

FIGS. 6 and 7 are sectional views for explaining a method of manufacturing the upper substrate of FIG. 2. FIGS. 6 and 7 show a method of manufacturing the upper substrate of FIG. 5.

Referring to FIG. 6, the color conversion layers C1, C2 and C3 may be formed by the inkjet process.

Specifically, an inkjet head IH may discharge ink to the color filter area CA. For example, the inkjet head IH may discharge first ink including the first color conversion particle and the first scattering body to the first color filter area CA1, discharge second ink including the second color conversion particle and the second scattering body to the second color filter area CA2, and discharge third ink including the third scattering body to the third color filter area CA3. Accordingly, the first color conversion layer C1 may be formed in the first color filter area CA1, the second color conversion layer C2 may be formed in the second color filter area CA2, and the third color conversion layer C3 may be formed in the third color filter area CA3.

After the first to third color conversion layers C1, C2 and C3 are formed, the passivation layer PV may be formed to cover the main partition wall MW, the sub-partition wall SW, and the first to third color conversion layers C1, C2, and C3.

Referring to FIG. 7, in the inkjet process, the inkjet head IH may discharge the ink outside the color filter area CA. The ink discharged outside the color filter area CA may be referred to as erroneous ink.

In one embodiment, the inkjet head IH may discharged first erroneous ink I1 on the main partition wall MW. The first erroneous ink I1 may form a first protrusion on the main partition wall MW, and the passivation layer PV covering the main partition wall MW may be damaged by the first protrusion. In addition, the lower substrate 200 coupled to the upper substrate 100 may be damaged by the first protrusion. Accordingly, the display performance of the display device may deteriorate.

In one embodiment, the inkjet head IH may discharge second erroneous ink I2 on the sub-partition wall SW. For example, the inkjet head IH may discharge the second erroneous ink I2 on the fourth sub-partition wall SSW1. The second erroneous ink I2 may form a second protrusion on the sub-partition wall SW, and the passivation layer PV covering the sub-partition wall SW may be damaged by the second protrusion. In addition, the lower substrate 200 coupled to the upper substrate 100 may be damaged by the second protrusion. Accordingly, the display performance of the display device may deteriorate.

In one embodiment, the inkjet head IH may discharge third erroneous ink I3 to the dummy accommodation area DA. In other words, the inkjet head IH may discharge the third erroneous contact ink I3 to the sub-dummy accommodation areas partitioned by the sub-partition wall SW. The third erroneous ink I3 discharged to the sub-dummy accommodation areas may form a third protrusion, however, the passivation layer PV and the lower substrate 200 may not be damaged by the third protrusion.

Figure 8:
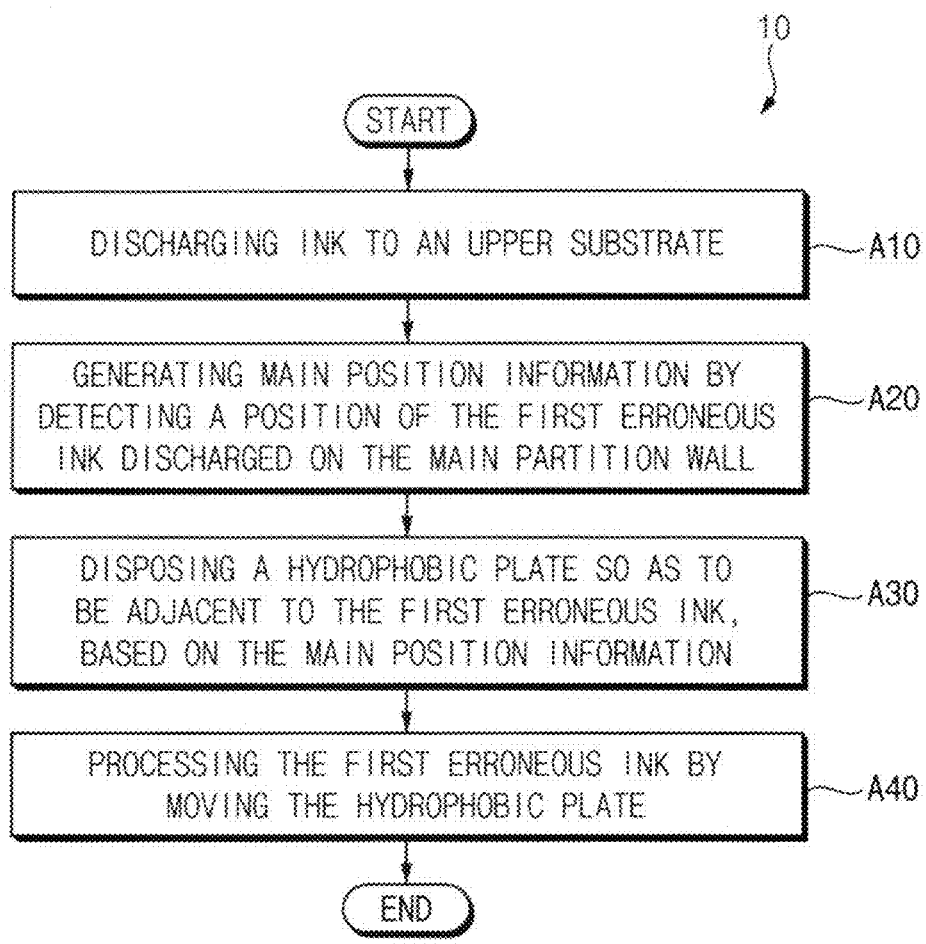
FIG. 8 is a flowchart for explaining one embodiment of a method of manufacturing the display device of FIG. 1.

FIG. 8 is a flowchart for explaining one embodiment of a method of manufacturing the display device of FIG. 1. FIGS. 9 to 12 are perspective views for explaining the manufacturing method of FIG. 8.

Referring to FIG. 8, the method 10 of manufacturing the display device 1000 according to one embodiment of the present invention may include: discharging the ink to the upper substrate 100 (A10); generating main position information by detecting a position of the first erroneous ink I1 discharged on the main partition wall MW (A20); disposing a hydrophobic plate HPL so as to be adjacent to the first erroneous ink I1, based on the main position information (A30); and processing the first erroneous ink I1 by moving the hydrophobic plate HPL (A40).

Figure 9:
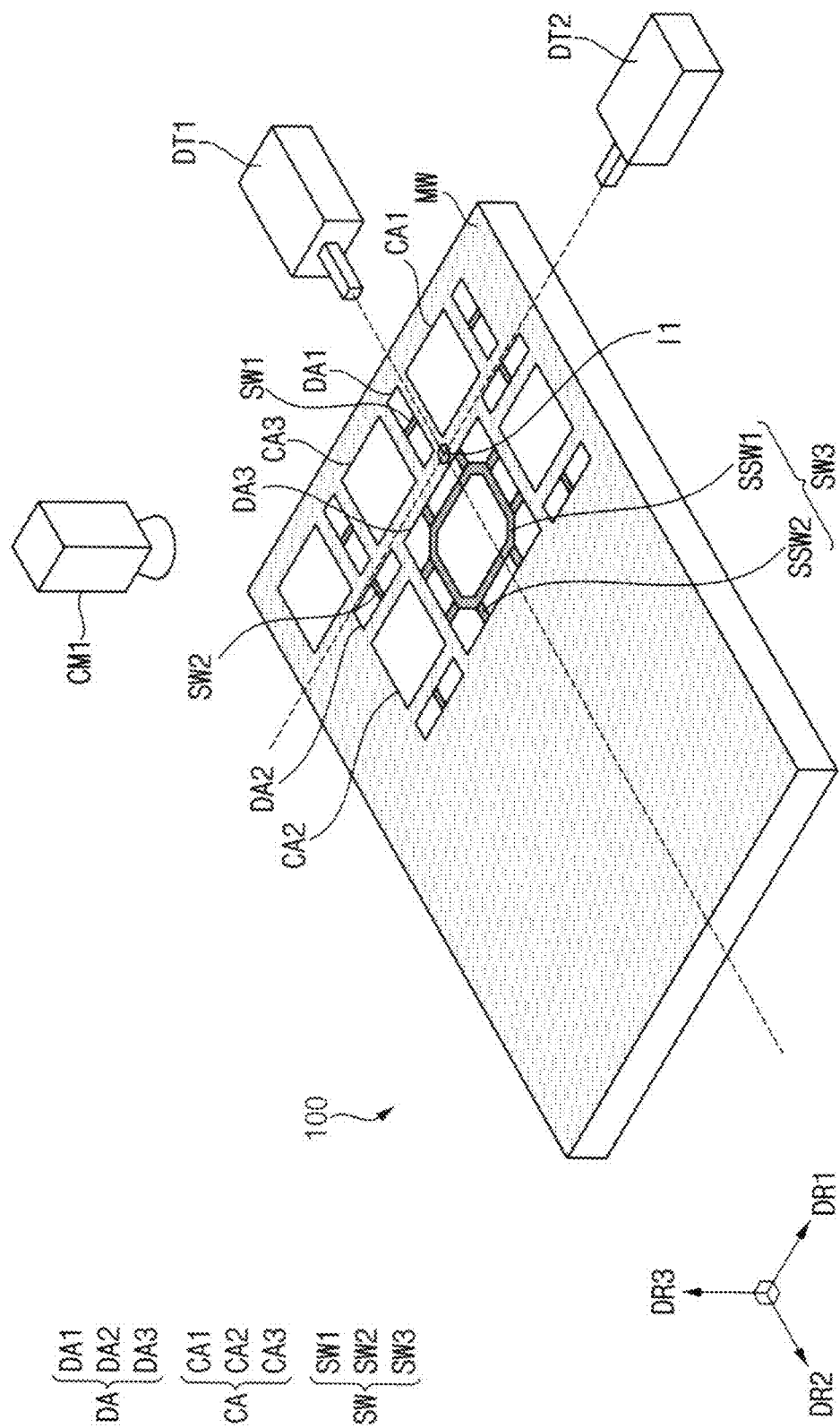
FIGS. 9 to 12 are perspective views for explaining the manufacturing method of FIG. 8.

Referring to FIG. 9, in the step of discharging the ink (A10), the first erroneous ink I1 may be discharged on the main partition wall MW. The position of the first erroneous ink I1 may be detected using at least one inspection equipment. For example, the inspection equipment may include a camera CM1, a first detector DT1 and a second detector DT2.

The camera CM1 may be spaced apart from the upper substrate 100 in a third direction DR3 perpendicular to the first direction DR1 and the second direction DR2. The camera CM1 may generate basic position information of the color filter area CA, the dummy accommodation area DA, the main partition wall MW, and the sub-partition wall SW by imaging the upper substrate 100.

The first detector DT1 may be moved in the first direction DR1 or in a direction opposite to the first direction DR1. The first detector DT1 may generate a first beam progressing in the second direction DR2. The first beam may be changed in wavelength or refracted while passing through the first erroneous ink I1. The wavelength change or refraction of the first beam may be measured, so that first position information of the first erroneous ink I1 in the first direction DR1 may be measured.

The second detector DT2 may be moved in the second direction DR2 or in a direction opposite to the second direction DR2. The second detector DT2 may generate a second beam progressing in the direction opposite to the first direction DR1. The second beam may be changed in wavelength or refracted while passing through the first erroneous ink I1. The wavelength change or refraction of the second beam may be measured, so that second position information of the first erroneous ink I1 in the second direction DR2 may be measured.

The main position information regarding the position of the first erroneous ink I1 on the upper substrate 100 may be generated, based on the basic position information, the first position information and the second position information measured using the camera CM1, the first detector DT1, and the second detector DT2, respectively (A20).

Figure 10:
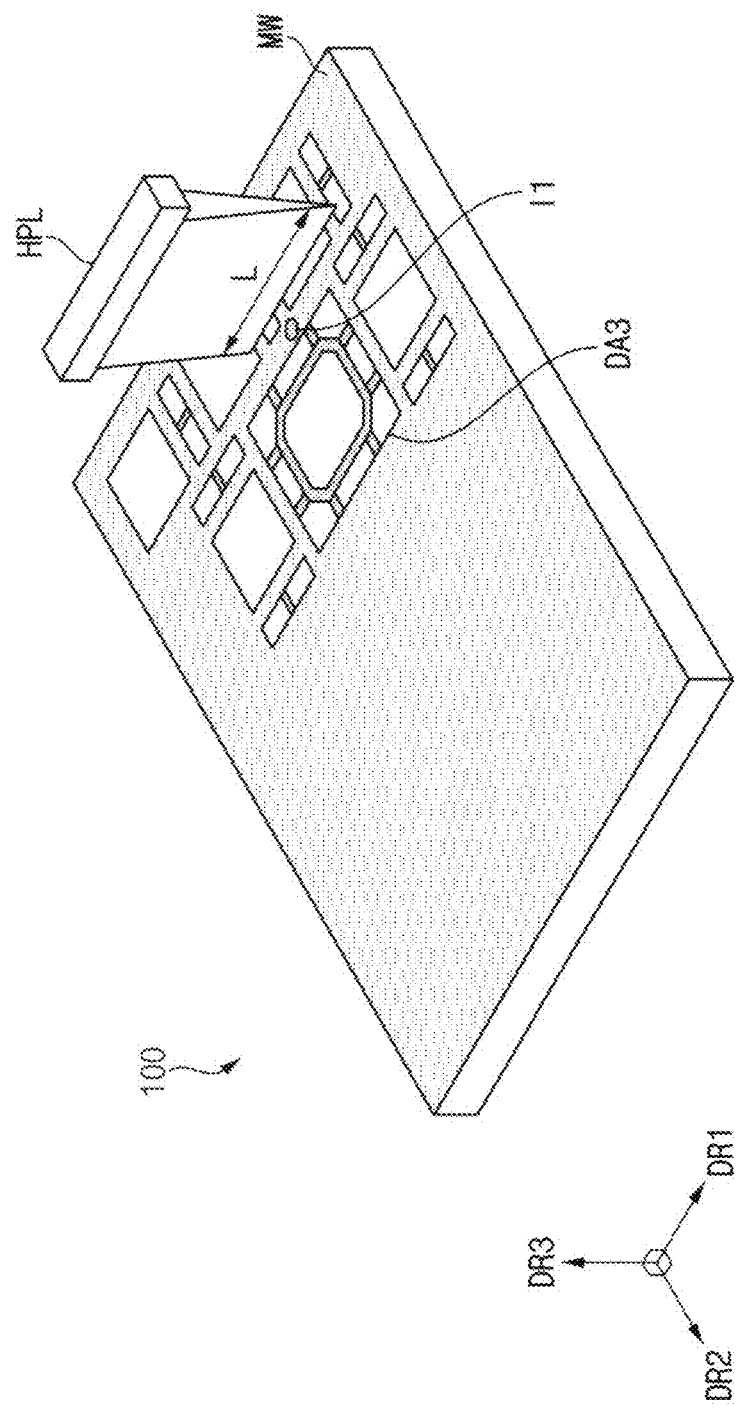

Referring to FIG. 10, the hydrophobic plate HPL may be disposed to be adjacent to the first erroneous ink I1, based on the main position information (A30). For example, when the first erroneous ink I1 and the third dummy accommodation area DA3 are adjacent to each other, the hydrophobic plate HPL may be disposed such that the first erroneous ink I1 is positioned between the hydrophobic plate HPL and the third dummy accommodation area DA3.

The hydrophobic plate HPL may have hydrophobicity. In one embodiment, the hydrophobicity of the hydrophobic plate HPL may be greater than the hydrophobicity of the main partition wall MW.

In one embodiment, a width L of the hydrophobic plate HPL may be smaller than or equal to a width L1 of the first row R1 described with reference to FIG. 2 in the second direction DR2.

Figure 11:
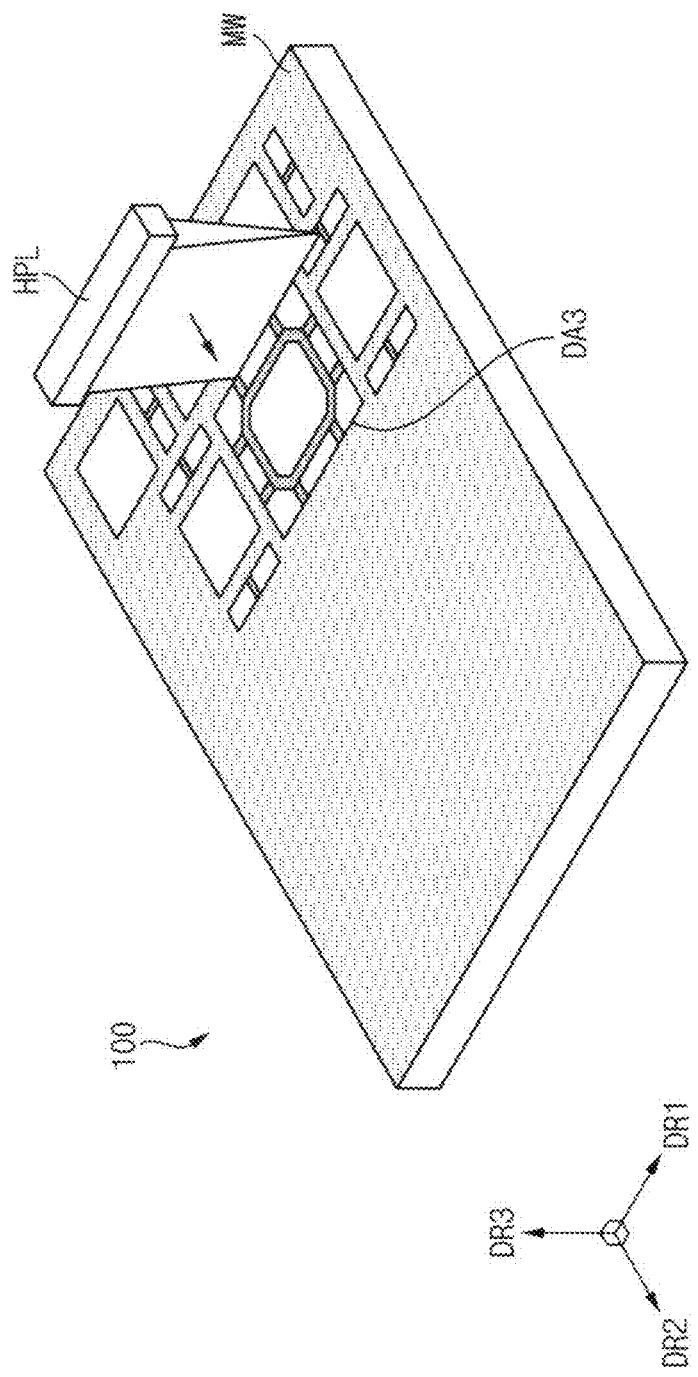
Figure 12:
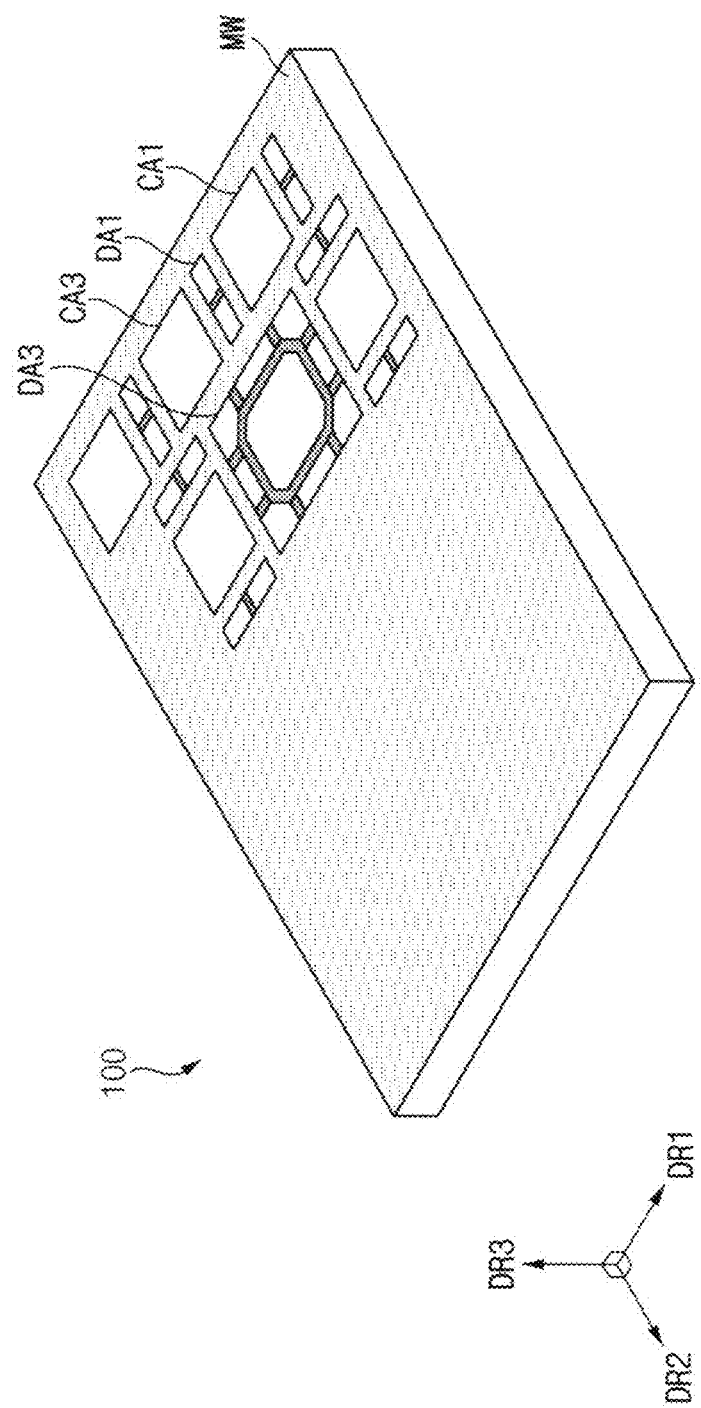

Referring to FIGS. 11 and 12, the hydrophobic plate HPL may come into contact with the main partition wall MW and then the hydrophobic plate HPL may be moved in the direction to the dummy accommodation area DA, so that the first erroneous ink I1 may be processed (A40). For example, the hydrophobic plate HPL may be moved in the second direction DR2 that is the direction from the first erroneous ink I1 to the third dummy accommodation area DA3. Accordingly, the first erroneous ink I1 may be pushed out in the second direction DR2 by the hydrophobic plate HPL, and the first erroneous ink I1 may be accommodated in the third dummy accommodation area DA3.

Figure 13:
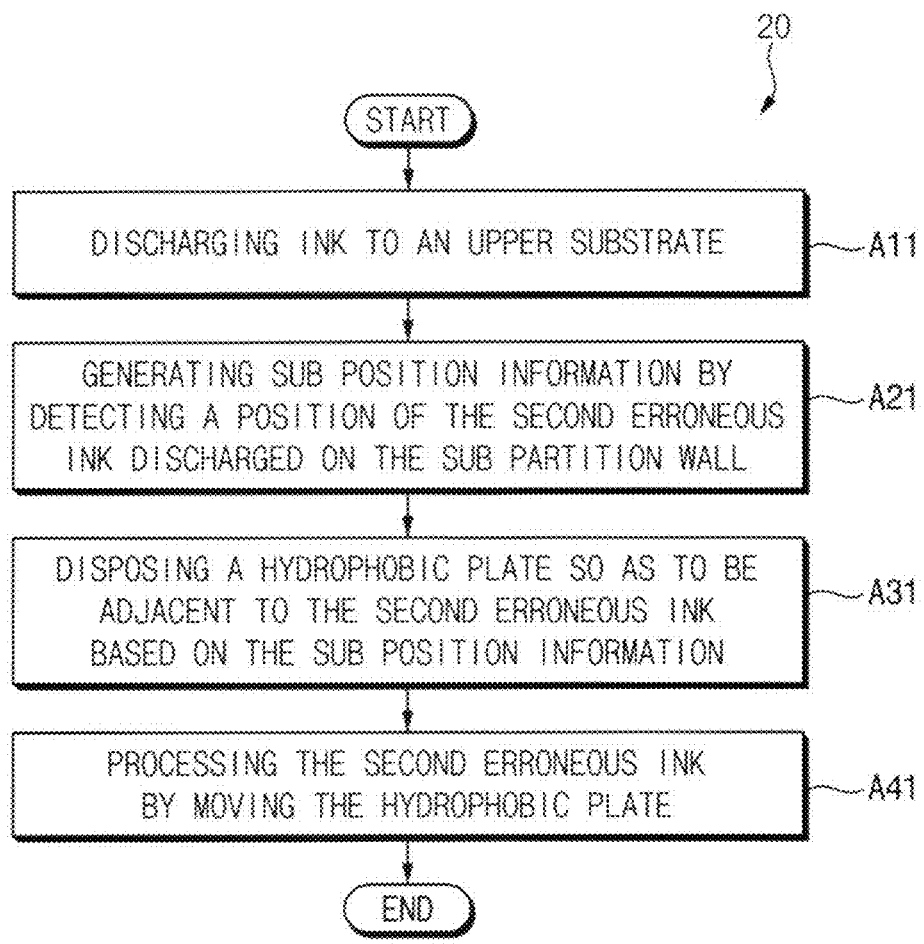
FIG. 13 is a flowchart for explaining another embodiment of the method of manufacturing the display device of FIG. 1.

FIG. 13 is a flowchart for explaining another embodiment of the method of manufacturing the display device of FIG. 1. FIGS. 14 to 17 are perspective views for explaining the manufacturing method of FIG. 13.

Referring to FIG. 13, the method 20 of manufacturing the display device 1000 according to another embodiment of the present invention may include: discharging the ink to the upper substrate 100 (A11); generating sub-position information by detecting a position of the second erroneous ink I2 discharged on the sub-partition wall MW (A21); disposing a hydrophobic plate HPL based on the sub-position information (A31); and processing the second erroneous ink I2 by moving the hydrophobic plate HPL (A41).

Figure 14:
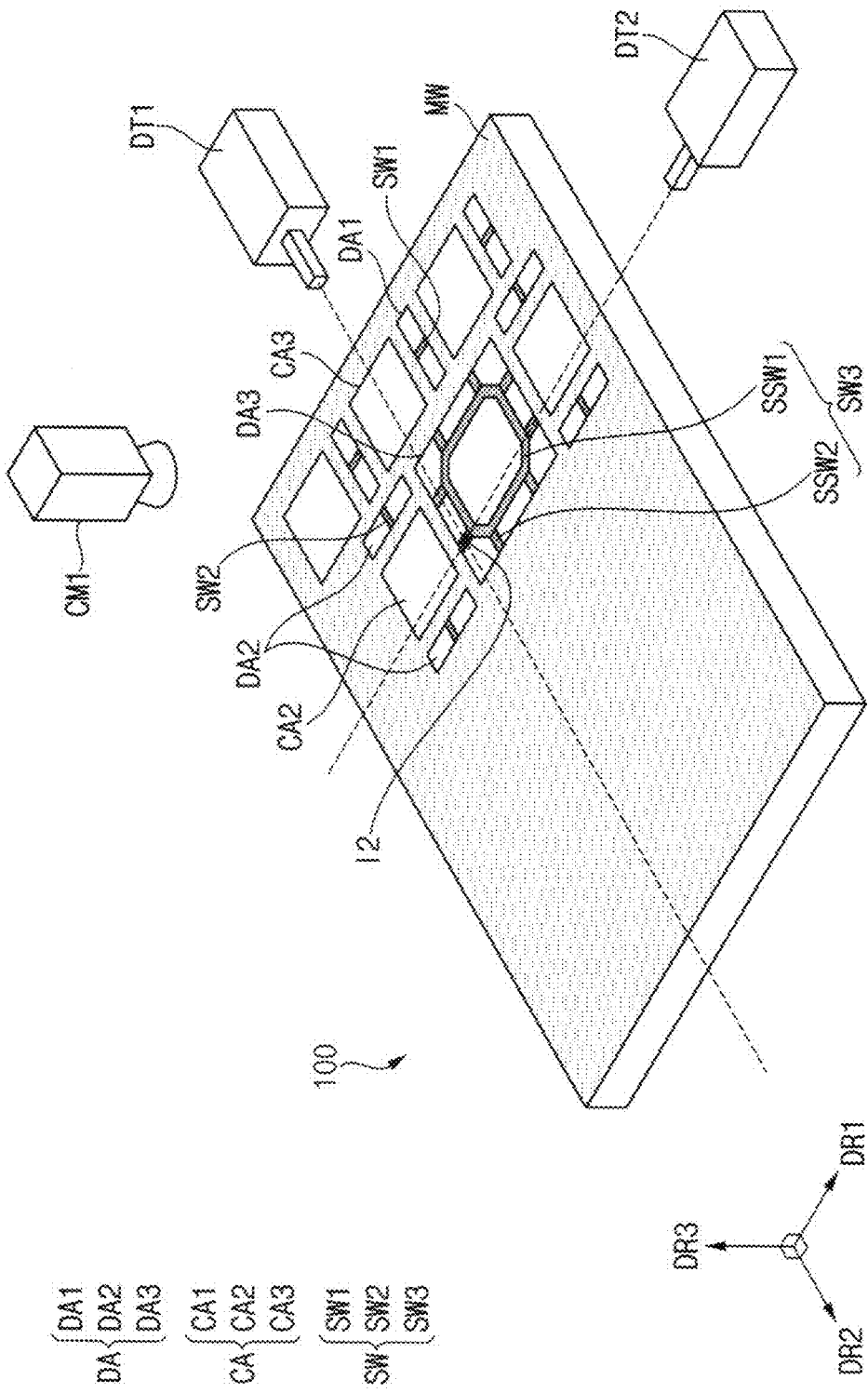
FIGS. 14 to 17 are perspective views for explaining the manufacturing method of FIG. 13.

Referring to FIG. 14, in the step of discharging the ink (A11), the second erroneous ink I2 may be discharged on the sub-partition wall SW. The position of the second erroneous ink I2 may be detected using the inspection equipment described with reference to FIG. 9. Accordingly, the sub-position information may be generated (A21).

Figure 15:
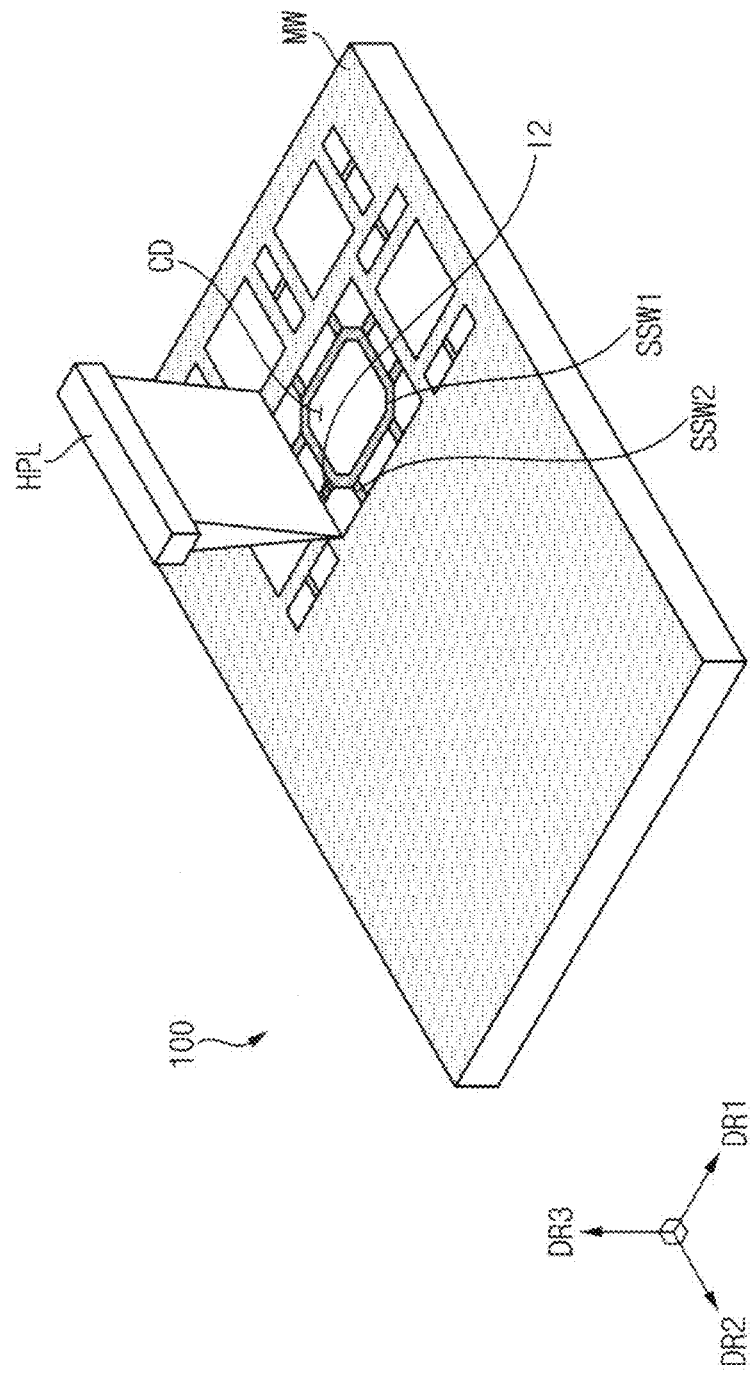

Referring to FIG. 15, the hydrophobic plate HPL may be disposed so as to be adjacent to the second erroneous ink I2, based on the sub-position information (A31). For example, the hydrophobic plate HPL may be disposed, such that the second erroneous ink I2 is positioned between a central area CD, which is defined as an area surrounded by the fourth sub-partition wall SSW1 in the third dummy accommodation area DA3, and the hydrophobic plate HPL. The hydrophobic plates HPL may be substantially the same as the hydrophobic plate HPL described with reference to FIGS. 9 and 10.

Figure 16:
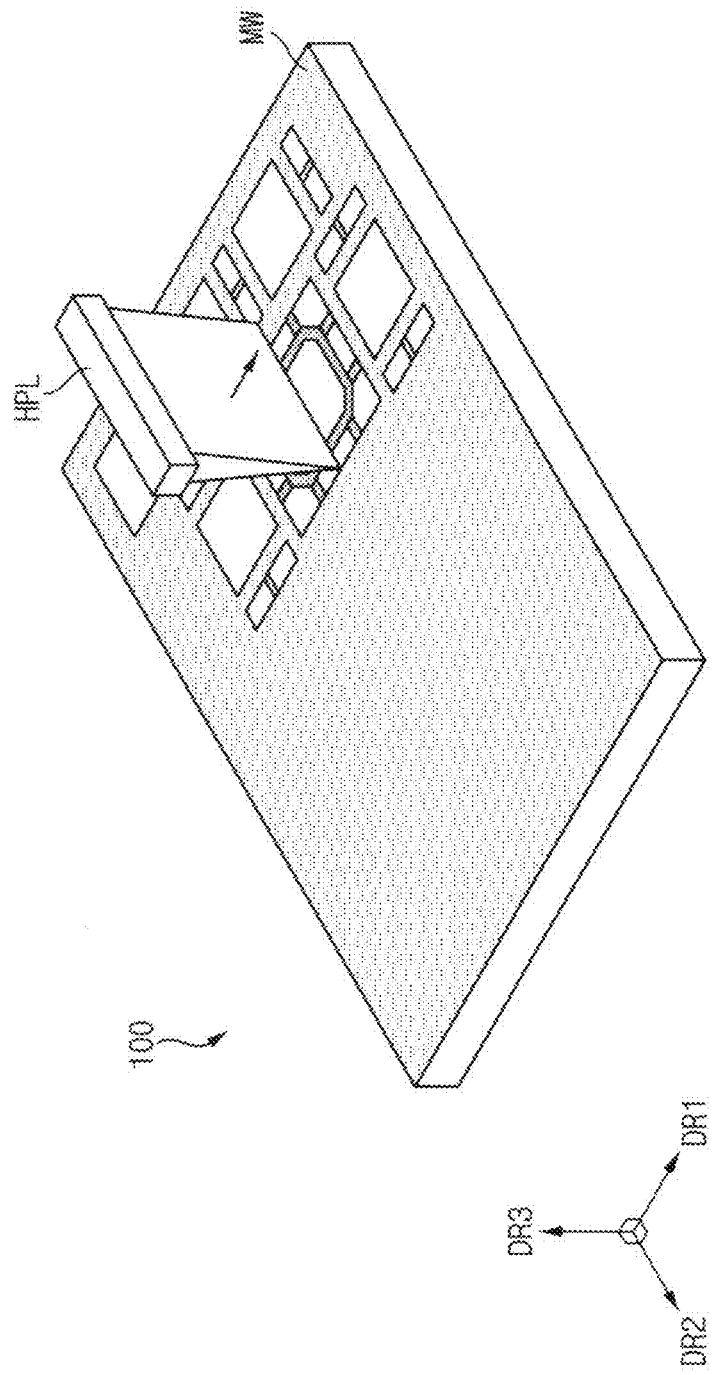
Figure 17:
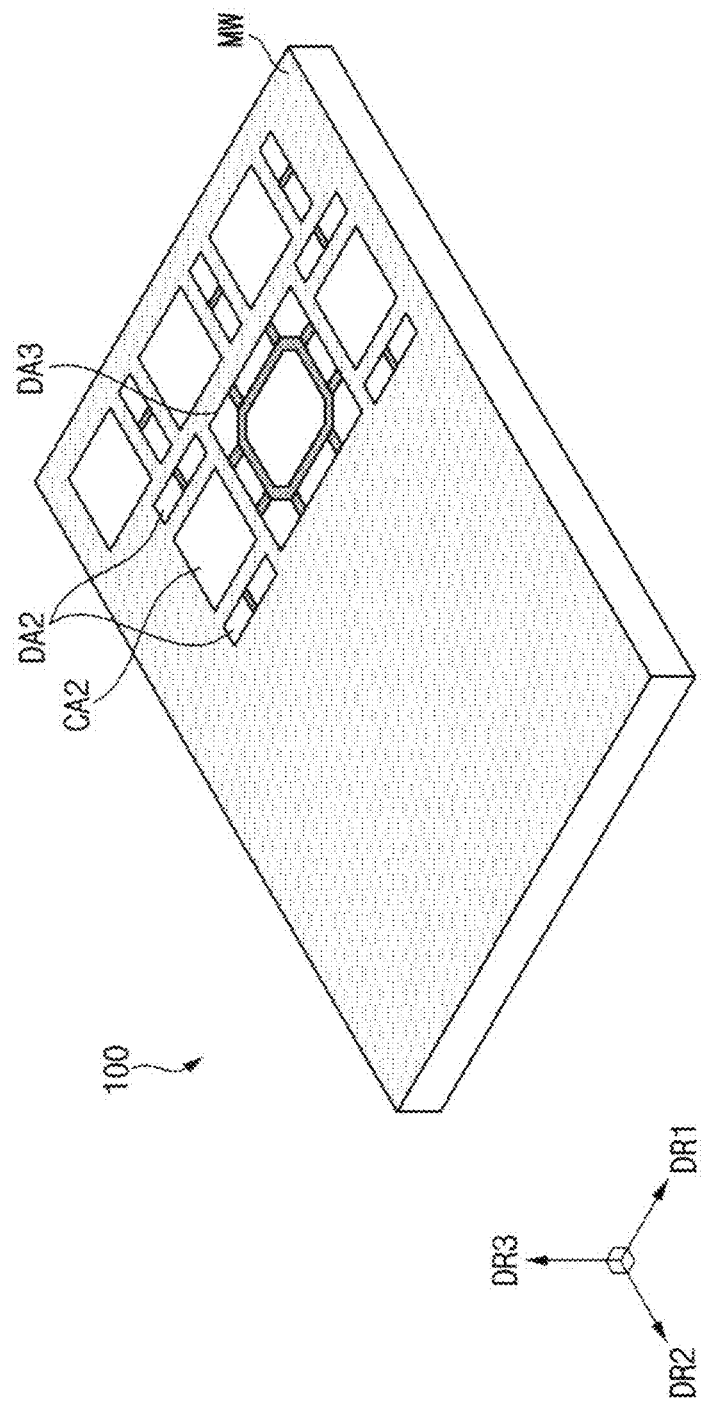

Referring to FIGS. 16 and 17, the hydrophobic plate HPL may come into contact with the sub-partition wall SW, and then the hydrophobic plate HPL may be moved in the direction to one of the sub-dummy accommodation areas, so that the second erroneous ink I2 may be processed (A41). For example, after the hydrophobic plate HPL comes into contact with the fifth sub-partition wall SSW2, the hydrophobic plate HPL may be moved in the first direction DR1 that is the direction from the second erroneous ink I2 to the central area CD. Accordingly, the second erroneous ink I2 may be pushed out in the first direction DR1 by the hydrophobic plate HPL, and the second erroneous ink I2 may be accommodated in the central area CD.

Figure 18:
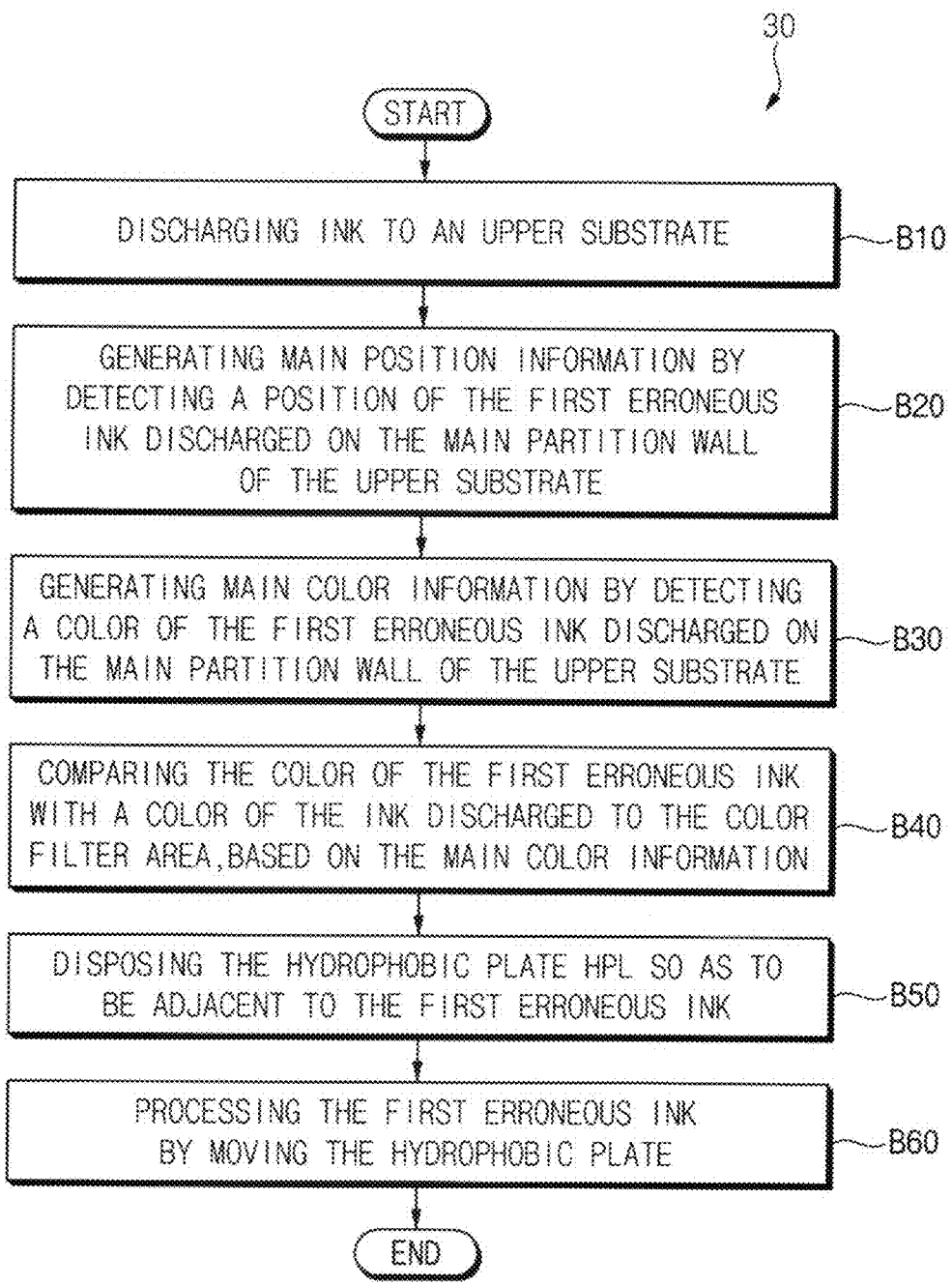
FIG. 18 is a flowchart for explaining still another embodiment of the method of manufacturing the display device of FIG. 1.

FIG. 18 is a flowchart for explaining still another embodiment of the method of manufacturing the display device of FIG. 1. FIGS. 19 to 22 are perspective views for explaining the manufacturing method of FIG. 18.

Referring to FIG. 18, the method 30 of manufacturing the display device 1000 according to still another embodiment of the present invention may include: discharging the ink to the upper substrate 100 (B10); generating main position information by detecting a position of the first erroneous ink I1 discharged on the main partition wall MW (B20); generating main color information by detecting a color of the first erroneous ink I1 (B30); comparing the color of the first erroneous ink I1 with a color of the ink discharged to the color filter area CA, based on the main color information (B40); disposing the hydrophobic plate HPL so as to be adjacent to the first erroneous ink I1 (B50); and processing the first erroneous ink I1 by moving the hydrophobic plate HPL (B60).

Figure 19:
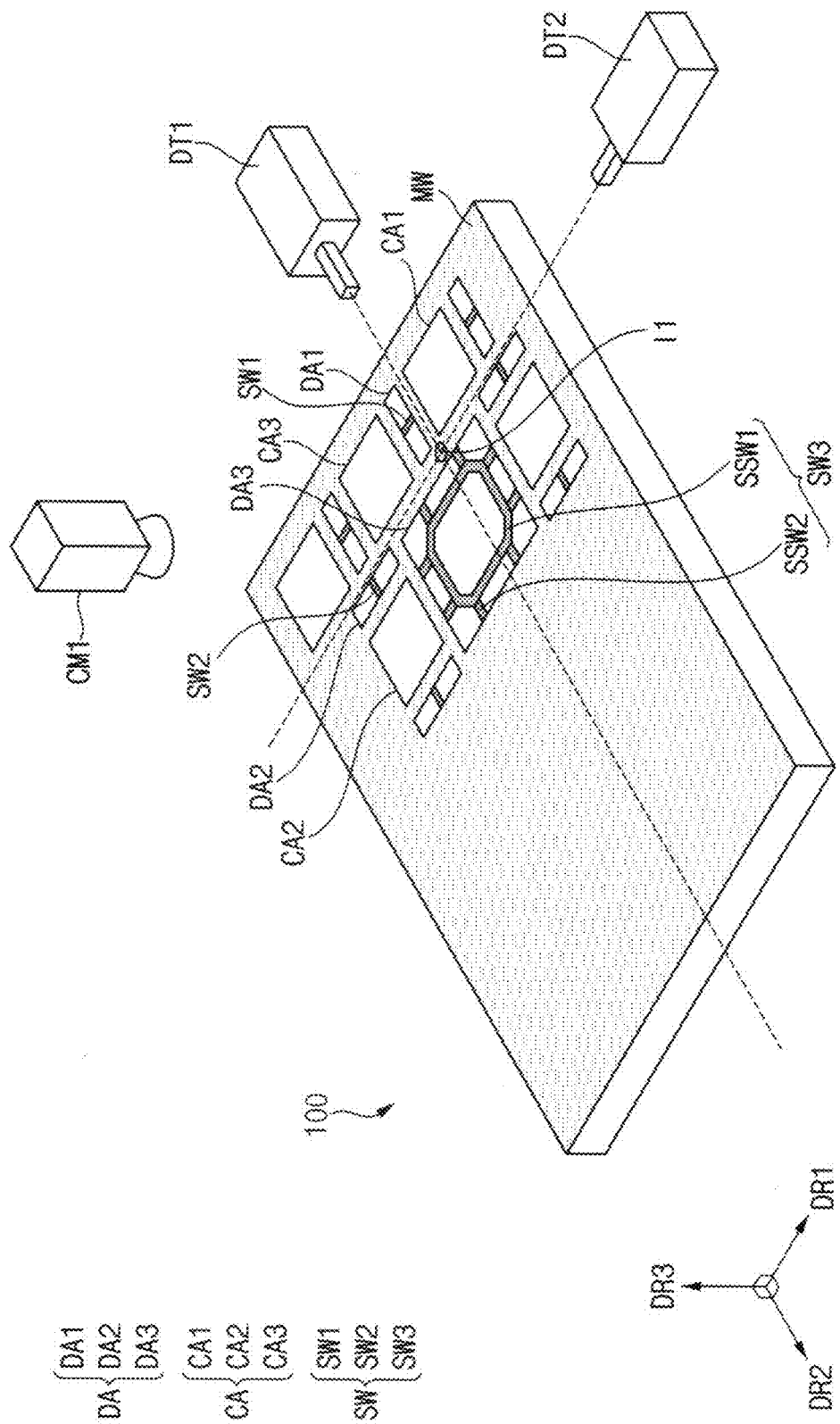
FIGS. 19 to 22 are perspective views for explaining the manufacturing method of FIG. 18.

Referring to FIG. 19, in the step of discharging the ink (B10), the first erroneous ink I1 may be discharged on the main partition wall MW. The position and color of the first erroneous ink I1 may be detected using at least one inspection equipment. For example, the inspection equipment may include a camera CM1, a first detector DT1 and a second detector DT2.

The first detector DT1 may be moved in the first direction DR1 or in a direction opposite to the first direction DR1. The first detector DT1 may generate a first beam progressing in the second direction DR2. The first beam may be changed in wavelength or refracted while passing through the first erroneous ink I1. The wavelength change or refraction of the first beam may be measured, so that first position information of the first erroneous ink I1 in the first direction DR1 may be measured.

The second detector DT2 may be moved in the second direction DR2 or in a direction opposite to the second direction DR2. The second detector DT2 may generate a second beam progressing in the direction opposite to the first direction DR1. The second beam may be changed in wavelength or refracted while passing through the first erroneous ink I1. The wavelength change or refraction of the second beam may be measured, so that second position information of the first erroneous ink I1 in the second direction DR2 may be measured.

The camera CM1 may be spaced apart from the upper substrate 100 in a third direction DR3 perpendicular to the first direction DR1 and the second direction DR2. The camera CM1 may generate basic position information of the color filter area CA, the dummy accommodation area DA, the main partition wall MW, and the sub-partition wall SW, by imaging the upper substrate 100.

The main position information regarding the position of the first erroneous ink I1 on the upper substrate 100 may be generated, based on the basic position information, the first position information and the second position information measured using the camera CM1, the first detector DT1, and the second detector DT2, respectively (B20).

The camera CM1 may generate basic color information by detecting the color of the ink discharged to the color filter area CA. The camera CM1 may generate main color information by detecting the color of the first erroneous ink I1 by imaging the first erroneous ink I1 based on the first position information and the second position information (B30).

Figure 20:
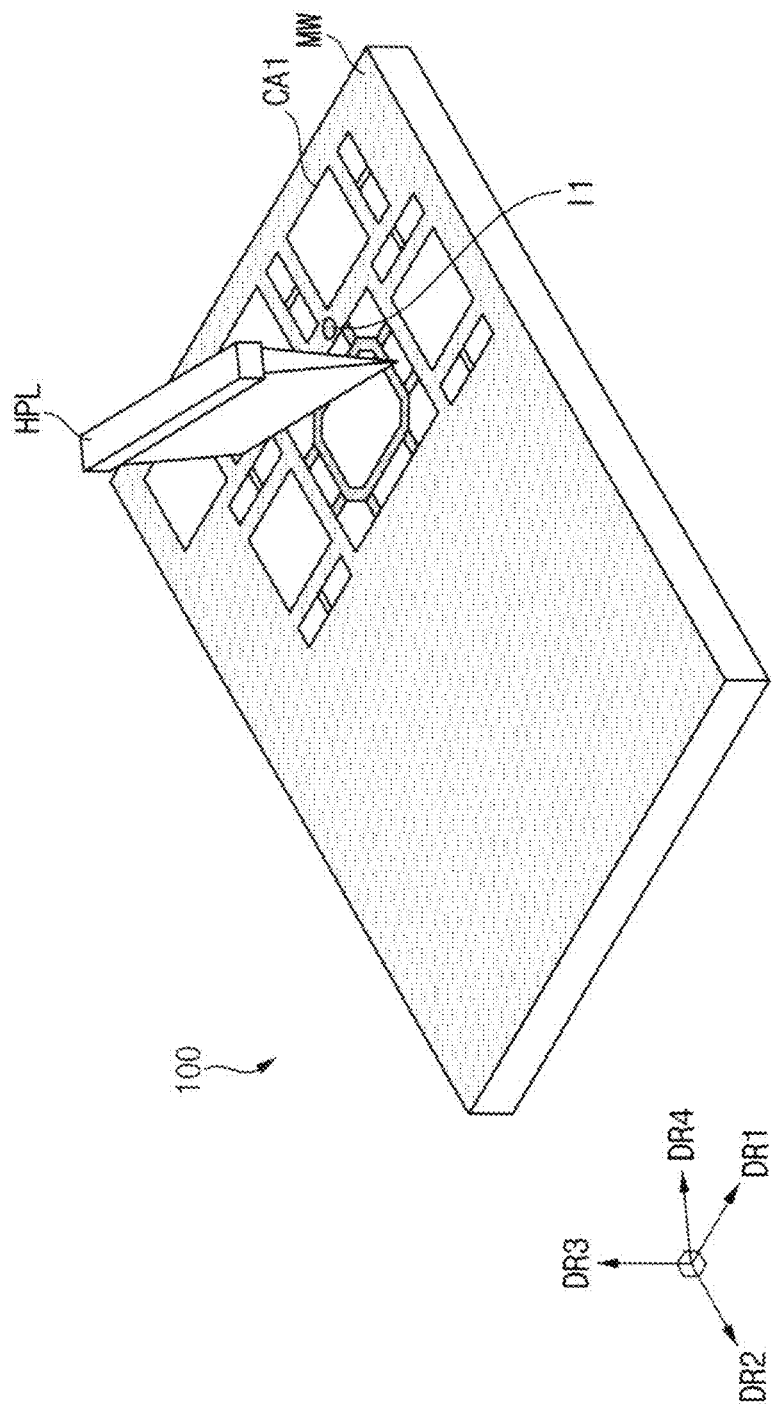

Referring to FIG. 20, the color of the first erroneous ink I1 may be compared with the color of the ink discharged to the color filter area CA, based on the main color information (B40). For example, after the color of the first erroneous ink I1 is identified based on the main color information, the position of the first color filter area CA1 adjacent to the first erroneous ink I1 is identified based on the basic position information and the main position information, and the color of the ink discharged to the first color filter area CA1 adjacent to the first erroneous ink I1 may be identified based on the basic color information, so that the color of the first erroneous ink I1 may be compared with the color of the ink discharged to the first color filter area CA1 adjacent to the first erroneous ink I1.

When the color of the first erroneous ink I1 is different from the color of the ink discharged to the first color filter area CA1 adjacent to the first erroneous ink I1, the upper substrate manufacturing method 10 described with reference to FIGS. 10 to 12 may be used, so that the first erroneous ink I1 may be accommodated in the third dummy accommodation area DA3.

When the color of the first erroneous ink I1 is the same as the color of the ink discharged to the first color filter area CA1 adjacent to the first erroneous ink I1, the hydrophobic plate HPL may be disposed to be adjacent to the first erroneous ink I1, based on the main position information (B50). For example, as shown in FIG. 20, the hydrophobic plate HPL may be disposed, such that the first erroneous ink I1 is positioned between the hydrophobic plate HPL and first color filter area CA1 adjacent to the first erroneous ink I1.

Figure 21:
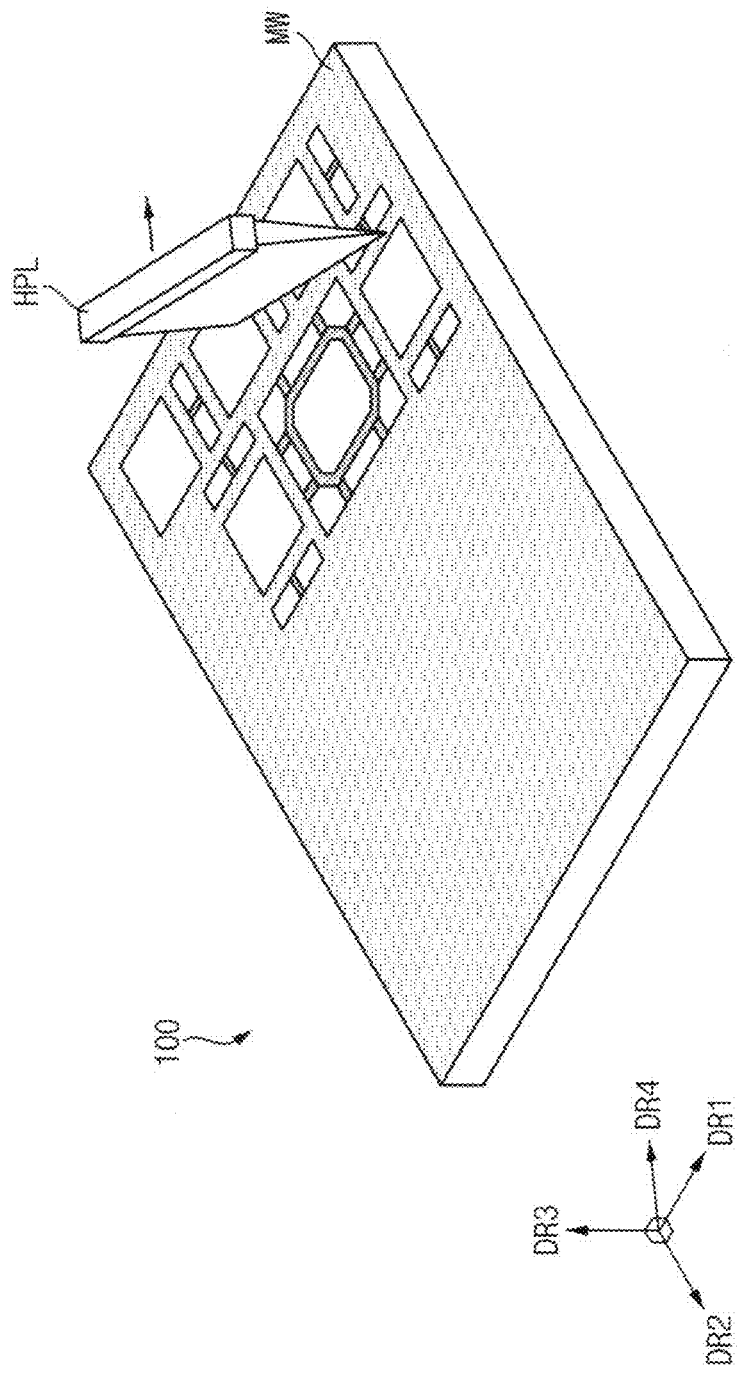
Figure 22:
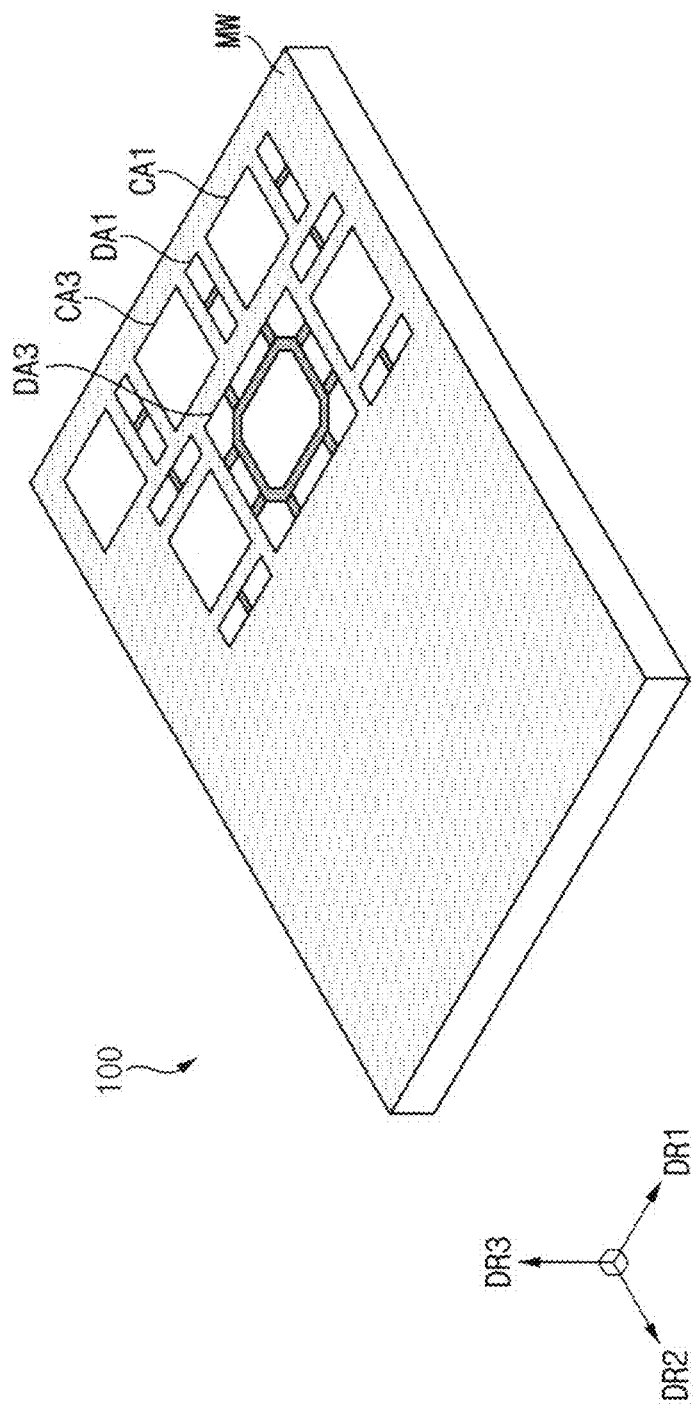

Referring to FIGS. 21 and 22, when the color of the first erroneous ink I1 is the same as the color of the ink discharged to the first color filter area CA1 adjacent to the first erroneous ink I1, the hydrophobic plate HPL may come into contact with the main partition wall MW and then the hydrophobic plate HPL may be moved in the direction to the first color filter area CA1, so that the first erroneous ink I1 may be processed (B60). For example, the hydrophobic plate HPL may be moved in a fourth direction DR4 that is the direction from the first erroneous ink I1 to the first color filter area CA1 while intersecting the first direction DR1 and the second direction DR2. Accordingly, the first erroneous ink I1 may be pushed out in the fourth direction DR4 by the hydrophobic plate HPL, and the first erroneous ink I1 may be accommodated in the first color filter area CA1.

Figure 23:
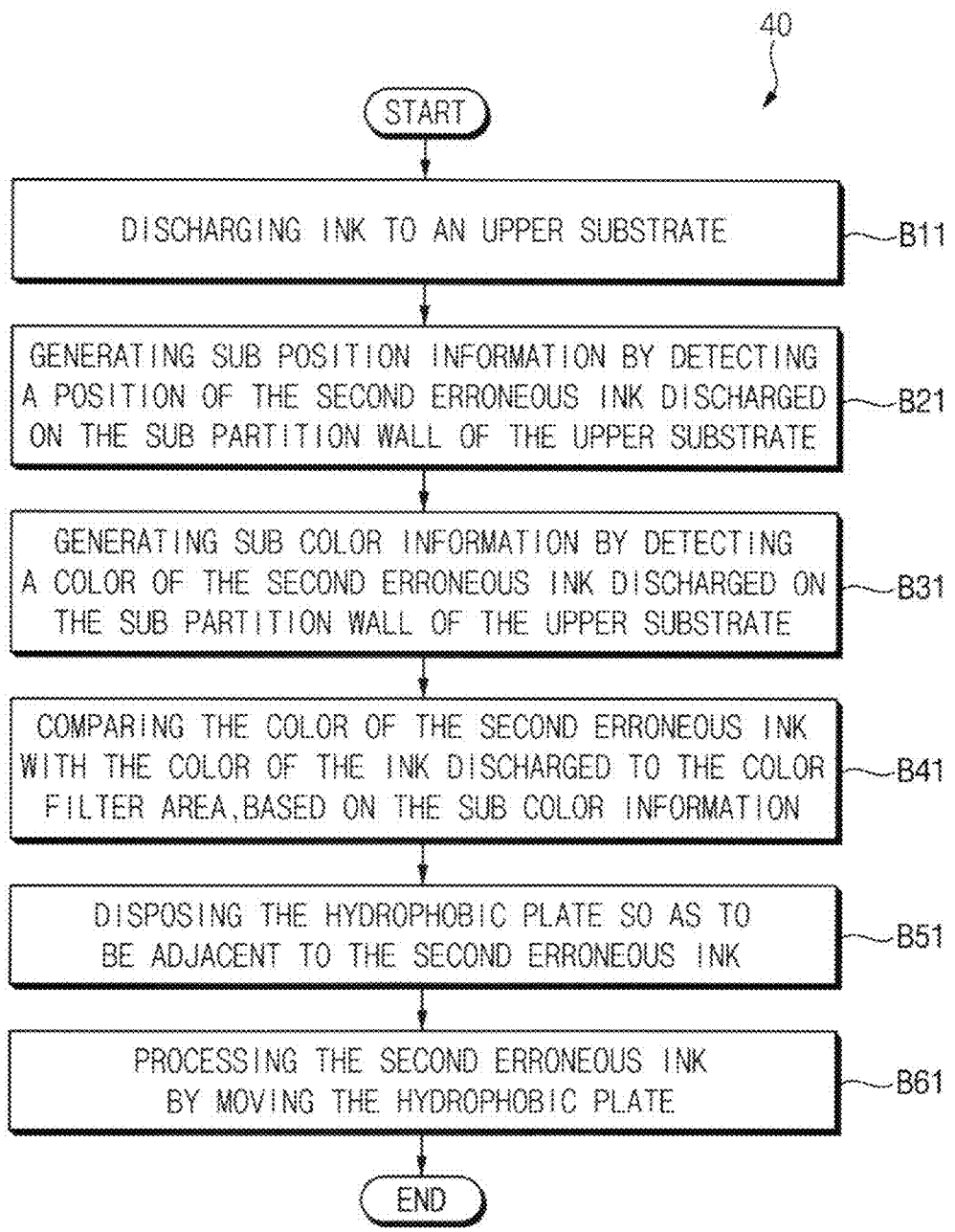
FIG. 23 is a flowchart for explaining yet another embodiment of the method of manufacturing the display device of FIG. 1.

FIG. 23 is a flowchart for explaining yet another embodiment of the method of manufacturing the display device of FIG. 1. FIGS. 24 to 27 are perspective views for explaining the manufacturing method of FIG. 23.

Referring to FIG. 23, the method 40 of manufacturing the display device 1000 according to yet another embodiment of the present invention may further include: discharging the ink to the upper substrate 100 (B11); generating sub-position information by detecting a position of the second erroneous ink I2 discharged on the sub-partition wall SW (B21); generating sub-color information by detecting a color of the second erroneous ink I2 (B31); comparing the color of the second erroneous ink I2 with the color of the ink discharged to the color filter area CA, based on the sub-color information (B41); disposing the hydrophobic plate HPL so as to be adjacent to the second erroneous ink I2 (B51); and processing the second erroneous ink I2 by moving the hydrophobic plate HPL (B61).

Figure 24:
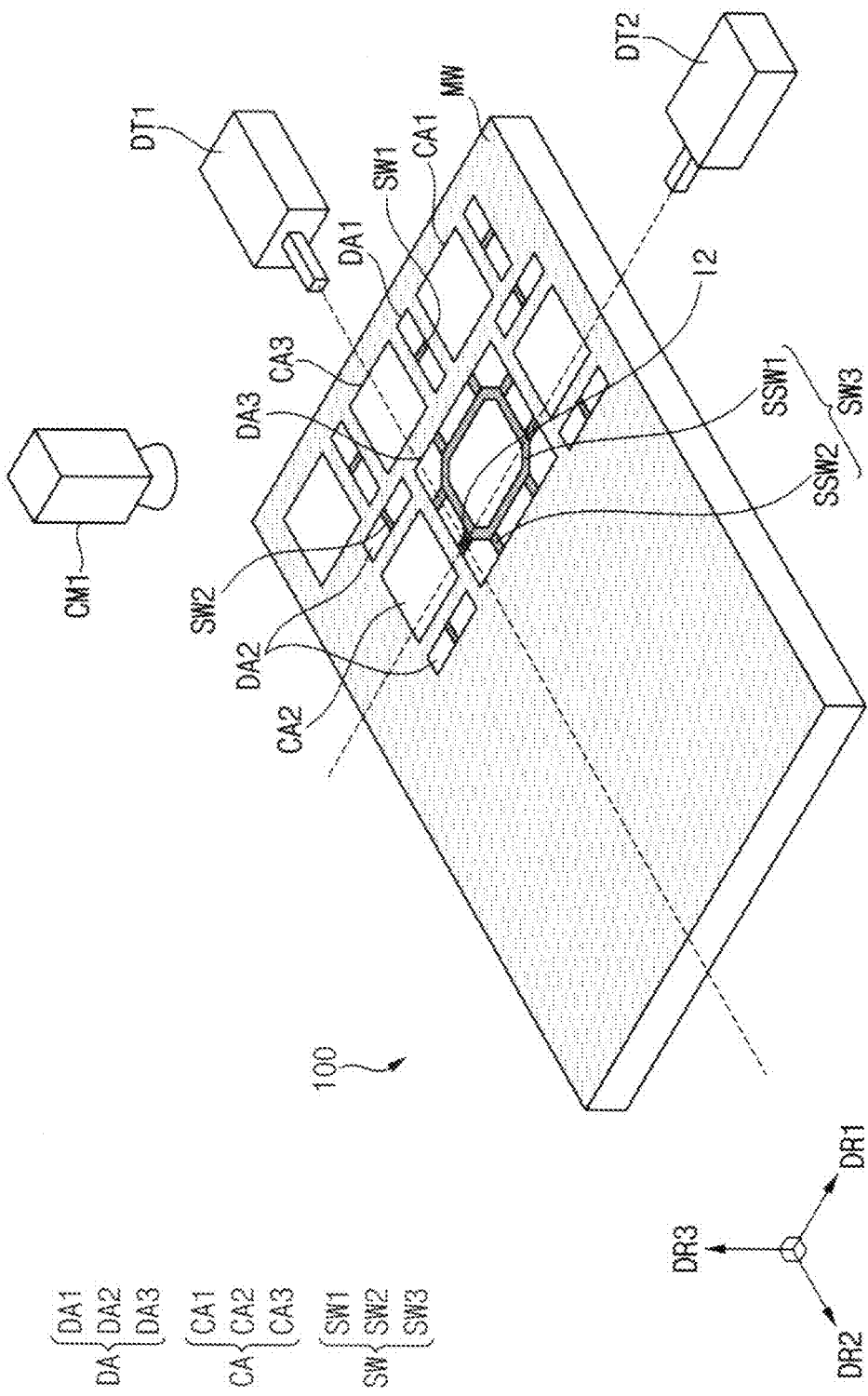
FIGS. 24 to 27 are perspective views for explaining the manufacturing method of FIG. 23.

Referring to FIG. 24, in the step of discharging the ink (B11), the second erroneous ink I2 may be discharged on the sub-partition wall SW. For example, the second erroneous ink I2 may be discharged on the fourth sub-partition wall SSW2. The position and color of the second erroneous ink I2 may be detected using the inspection equipment described with reference to FIG. 19. Accordingly, the sub-position information and the sub-color information may be generated (B21 and B31).

Figure 25:
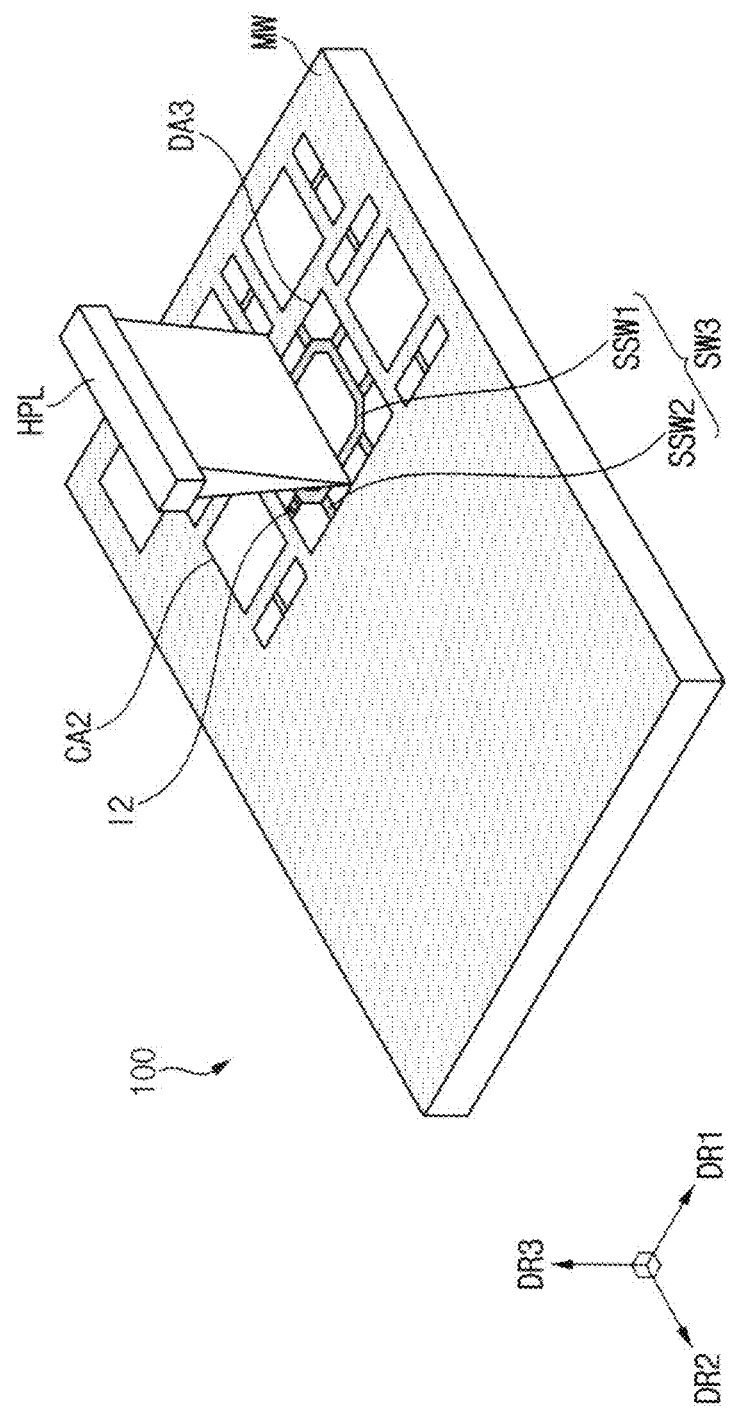

Referring to FIG. 25, the color of the second erroneous ink I2 may be compared with the color of the ink discharged to the color filter area CA, based on the sub-color information (B41). For example, the color of the second erroneous ink I2 may be compared with the color of the ink discharged to the second color filter area CA2 adjacent to the second erroneous ink I2.

When the color of the second erroneous ink I2 is different from the color of the ink discharged to the second color filter area CA2 adjacent to the second erroneous ink I2, the upper substrate manufacturing method 20 described with reference to FIGS. 15 to 16 may be used, so that the second erroneous ink 12 may be accommodated in the third dummy accommodation area DA3.

When the color of the second erroneous ink 12 is the same as the color of the ink discharged to the second color filter area CA2 adjacent to the second erroneous ink 12, the hydrophobic plate HPL may be disposed to be adjacent to the second erroneous ink 12, based on the sub-position information (B51). For example, as shown in FIG. 25, the hydrophobic plate HPL may be disposed, such that the second erroneous ink 12 is positioned between the hydrophobic plate HPL and second color filter area CA2 adjacent to the second erroneous ink I2.

Figure 26:
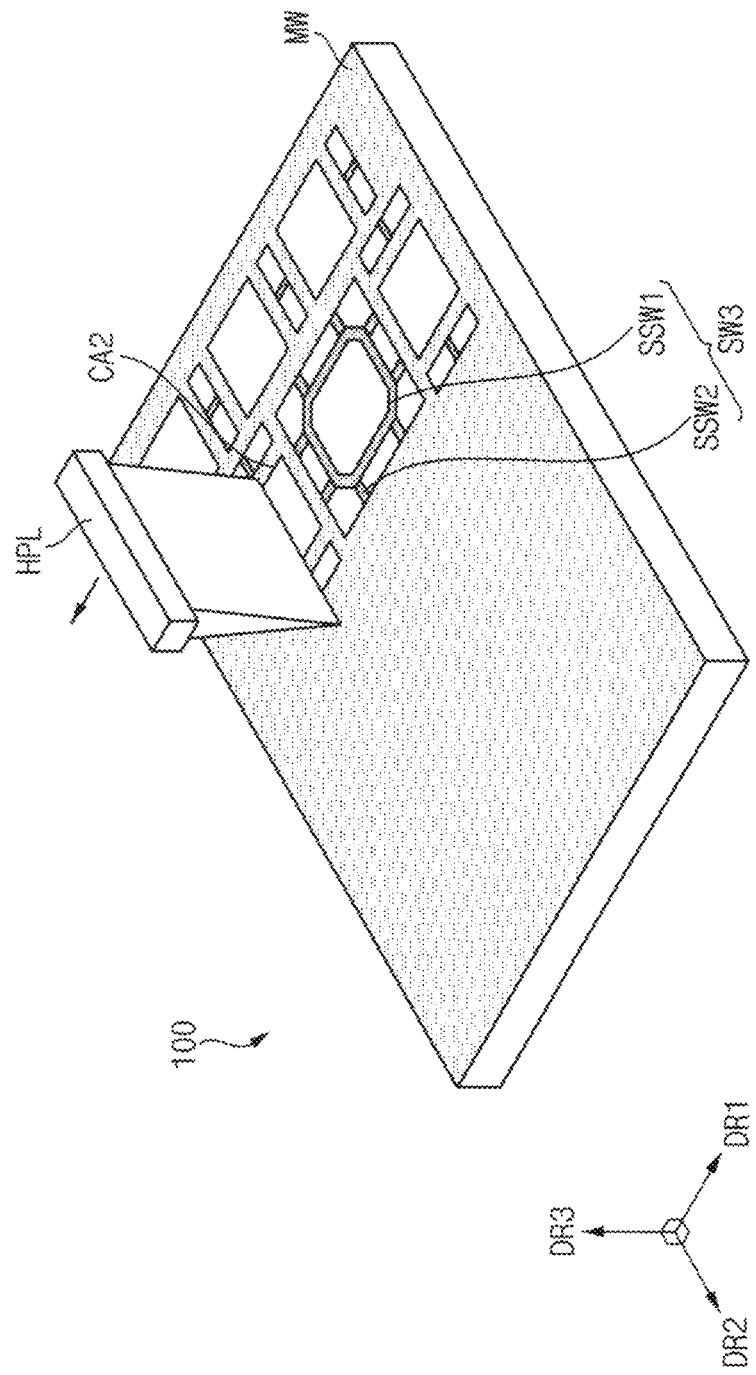
Figure 27:
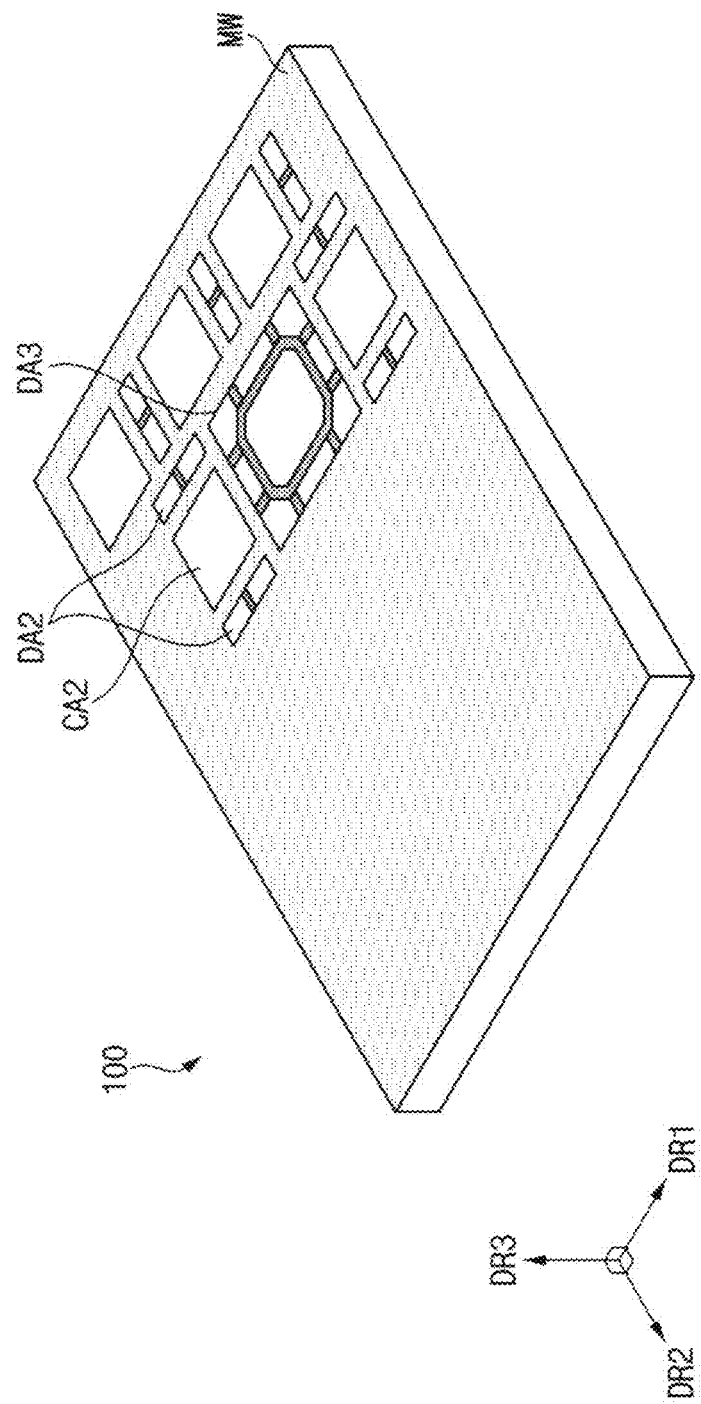

Referring to FIGS. 26 and 27, when the color of the second erroneous ink 12 is the same as the color of the ink discharged to the second color filter area CA2 adjacent to the second erroneous ink 12, the hydrophobic plate HPL may come into contact with the third sub-partition wall SW3, and then the hydrophobic plate HPL may be moved in the direction to the second color filter area CA2, so that the second erroneous ink I1 may be processed (B61). For example, the hydrophobic plate HPL may be moved in the direction opposite to the first direction DR1 that is the direction from the second erroneous ink 12 to the second color filter area CA2. Accordingly, the second erroneous ink 12 may be pushed out in the direction opposite to the first direction DR1 by the hydrophobic plate HPL, and the second erroneous ink 12 may be accommodated in the second color filter area CA2.

Although the methods have been described with reference to the embodiments of the present invention, it will be apparent to a person having ordinary skill in the art that various modifications and variations can be made in the present invention without departing from the scope and field of the following appended claims.

A display panel according to embodiments of the present invention may be applied to a method of manufacturing a display device included in a computer, a mobile phone, a smartphone, and a smart pad.

What is claimed is:

1. A method of manufacturing a display device, the method comprising:
    discharging ink onto a substrate including a main partition wall for partitioning a color filter area and a dummy accommodation area adjacent to the color filter area;
    generating main position information by detecting a position of first erroneous ink discharged on the main partition wall by measuring wavelength change of at least one beam generated by a detector;
    disposing a hydrophobic plate so as to be adjacent to the first erroneous ink based on the main position information;
    bringing the hydrophobic plate into contact with the main partition wall; and
    then moving the hydrophobic plate in a direction to the dummy accommodation area to accommodate the first erroneous ink in the dummy accommodation area,
    wherein the hydrophobic plate has hydrophobicity greater than hydrophobicity of the main partition wall.

2. The method of claim 1, wherein the substrate further includes a sub-partition wall for partitioning the dummy accommodation area into a plurality of sub-dummy accommodation areas.

3. The method of claim 2, further comprising:
    generating sub-position information by detecting a position of second erroneous ink discharged on the sub-partition wall;
    disposing the hydrophobic plate so as to be adjacent to the second erroneous ink, based on the sub-position information;
    bringing the hydrophobic plate into contact with the sub-partition wall; and
    then moving the hydrophobic plate in a direction to one of the sub-dummy accommodation areas to accommodate the second erroneous ink in the one of the sub-dummy accommodation areas.

4. The method of claim 2, wherein the sub-partition wall includes:
    a first sub-partition wall having an octagonal shape in a plan view; and
    a plurality of second sub-partition walls extending in directions to the main partition wall from vertices of the first sub-partition wall having the octagonal shape, respectively.

5. The method of claim 2, wherein the sub-partition wall has hydrophobicity.

6. The method of claim 1, wherein the color filter area includes:
    a first color filter area for accommodating first ink including a first color conversion particle and a first scattering body;
    a second color filter area for accommodating second ink including a second color conversion particle and a second scattering body; and
    a third color filter area for accommodating third ink including a third scattering body.

7. The method of claim 6, wherein the first color filter area and the third color filter area are alternately and repeatedly arranged in a first direction to define a first row, the second color filter area and the dummy accommodation area are alternately and repeatedly arranged in the first direction to define a second row, and the first row and the second row are alternately and repeatedly arranged in a second direction perpendicular to the first direction.

8. The method of claim 7, wherein the hydrophobic plate has a width less than or equal to a width of the first row in the second direction.

9. A method of manufacturing a display device, the method comprising:
    discharging ink onto a substrate including a color filter area, a dummy accommodation area and a main partition wall for partitioning the color filter area and the dummy accommodation area adjacent to the color filter area;
    generating main position information by detecting a position of first erroneous ink discharged on the main partition wall;
    generating main color information by detecting a color of the first erroneous ink;
    comparing the color of the first erroneous ink with a color of the ink discharged to the color filter area, based on the main color information;
    bringing a hydrophobic plate disposed adjacent to the first erroneous ink into contact with the main partition wall based on the main position information; and
    then moving the hydrophobic plate in a direction to the color filter area to accommodate the first erroneous ink in the color filter area, when the color of the first erroneous ink is identical to the color of the ink discharged to the color filter area.

10. The method of claim 9, further comprising:
    moving the hydrophobic plate in a direction to the dummy accommodation area to accommodate the first erroneous ink in the dummy accommodation area, when the color of the first erroneous ink is different from the color of the ink discharged to the color filter area.

11. The method of claim 9, wherein the substrate further includes a sub-partition wall for partitioning the dummy accommodation area into a plurality of sub-dummy accommodation areas.

12. The method of claim 11, further comprising:
generating sub-position information by detecting a position of second erroneous ink discharged on the sub-partition wall;
generating sub-color information by detecting a color of the second erroneous ink discharged on the sub-partition wall;
comparing the color of the second erroneous ink with the color of the ink discharged to the color filter area, based on the sub-color information;
bringing the hydrophobic plate disposed adjacent to the second erroneous ink into contact with the sub-partition wall based on the sub-position information; and
then moving the hydrophobic plate in the direction to the color filter area to accommodate the second erroneous ink in the color filter area, when the color of the second erroneous ink is identical to the color of the ink discharged to the color filter area.

13. The method of claim 12, further comprising:
moving the hydrophobic plate in a direction to one of the sub-dummy accommodation areas to accommodate the second erroneous ink in the one of the sub-dummy accommodation areas, when the color of the second erroneous ink is different from the color of the ink discharged to the color filter area.

14. The method of claim 11, wherein the sub-partition wall includes:
a first sub-partition wall having an octagonal shape in a plan view; and
a plurality of second sub-partition walls extending in directions to the main partition wall from vertices of the first sub-partition wall having the octagonal shape, respectively.

15. The method of claim 11, wherein the sub-partition wall has hydrophobicity.

16. The method of claim 9, wherein the main partition wall has hydrophobicity.

17. The method of claim 16, wherein the hydrophobic plate has hydrophobicity greater than the hydrophobicity of the main partition wall.

18. The method of claim 9, wherein the color filter area includes:
a first color filter area for accommodating first ink including a first color conversion particle and a first scattering body;
a second color filter area for accommodating second ink including a second color conversion particle and a second scattering body; and
a third color filter area for accommodating third ink including a third scattering body.

* * * * *